(12) United States Patent
Yoon et al.

(10) Patent No.: US 9,972,731 B2
(45) Date of Patent: May 15, 2018

(54) PRECURSOR FOR PREPARING LIGHT ABSORPTION LAYER OF SOLAR CELLS AND METHOD OF PREPARING THE SAME

(71) Applicant: LG CHEM, LTD., Seoul (KR)

(72) Inventors: Seokhee Yoon, Daejeon (KR); Eun Ju Park, Daejeon (KR); Hosub Lee, Daejeon (KR); Seokhyun Yoon, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days. days.

(21) Appl. No.: 15/509,816

(22) PCT Filed: Oct. 27, 2015

(86) PCT No.: PCT/KR2015/011355
§ 371 (c)(1),
(2) Date: Mar. 8, 2017

(87) PCT Pub. No.: WO2016/072654
PCT Pub. Date: May 12, 2016

(65) Prior Publication Data
US 2017/0301807 A1    Oct. 19, 2017

(30) Foreign Application Priority Data

Nov. 5, 2014   (KR) .................. 10-2014-0152663
May 13, 2015   (KR) .................. 10-2015-0066497

(51) Int. Cl.
*H01L 31/032* (2006.01)
*H01L 31/0445* (2014.01)
*H01L 31/18* (2006.01)
*H01L 31/0224* (2006.01)

(52) U.S. Cl.
CPC ...... *H01L 31/0326* (2013.01); *H01L 31/0445* (2014.12); *H01L 31/1864* (2013.01); *H01L 31/022425* (2013.01)

(58) Field of Classification Search
None
See application file for complete search history.

(56) References Cited

U.S. PATENT DOCUMENTS

2013/0221489 A1   8/2013   Cao et al.

FOREIGN PATENT DOCUMENTS

KR   10-2012-0089159 A   8/2012
KR   10-2013-0121129 A   11/2013

*Primary Examiner* — Asok K Sarkar
(74) *Attorney, Agent, or Firm* — Dentons US LLP

(57) ABSTRACT

Disclosed are a precursor for preparing a light absorption layer of a solar cell including (a) an aggregate-phase composite including a first phase including a copper (Cu)-tin (Sn) bimetallic metal and a second phase including zinc (Zn)-containing chalcogenide, or including the first phase including a copper (Cu)-tin (Sn) bimetallic metal, the second phase including zinc (Zn)-containing chalcogenide and a third phase including copper (Cu)-containing chalcogenide; or (b) core-shell structured nanoparticles including a core including copper (Cu)-tin (Sn) bimetallic metal nanoparticles and a shell including zinc (Zn)-containing chalcogenide, or the zinc (Zn)-containing chalcogenide and copper (Cu)-containing chalcogenide; or (c) a mixture thereof, and a method of preparing the same.

26 Claims, 17 Drawing Sheets

[FIG. 1]
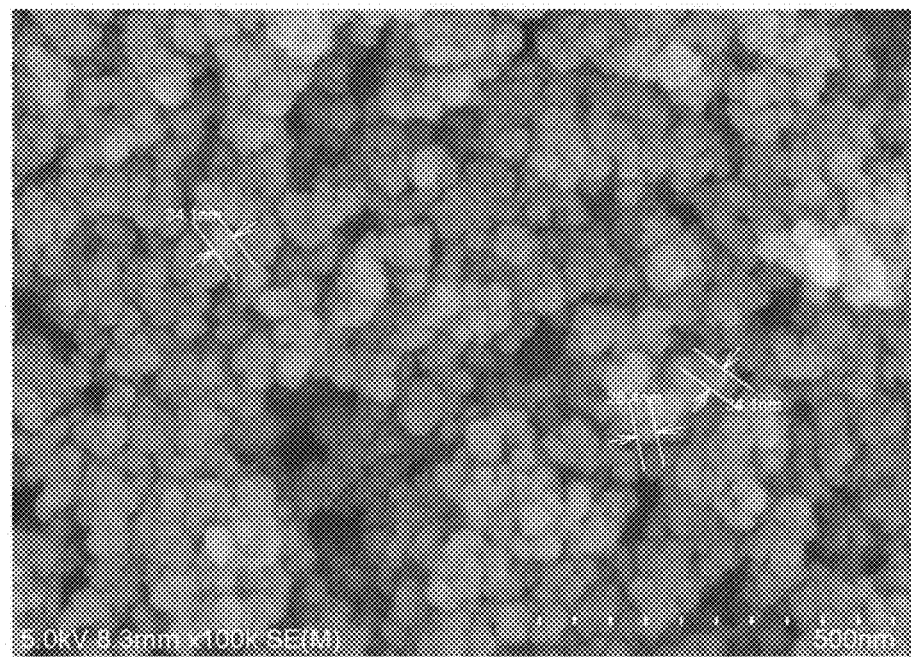
[FIG. 2]
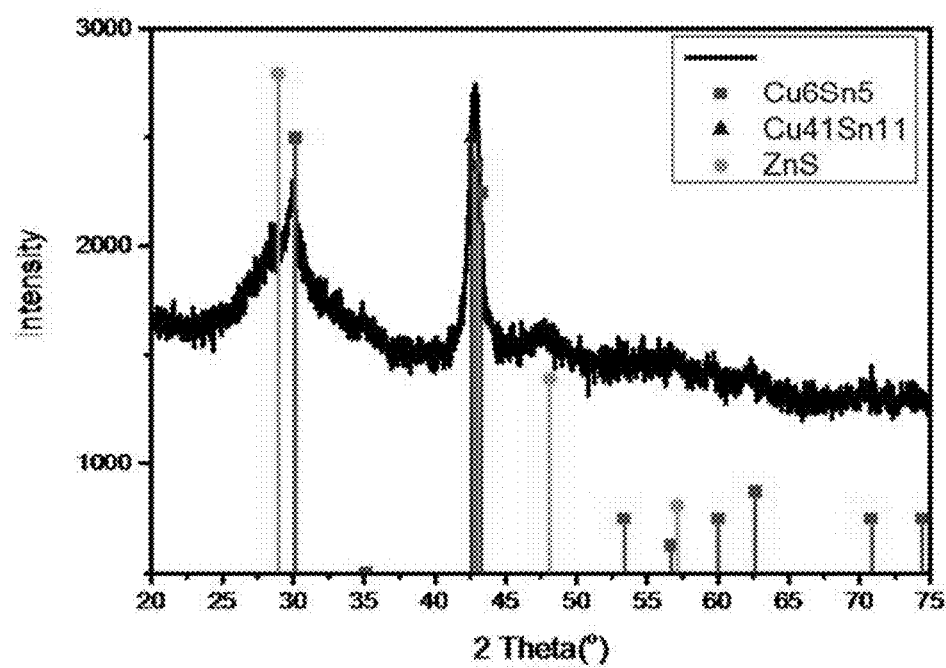

[FIG. 3]
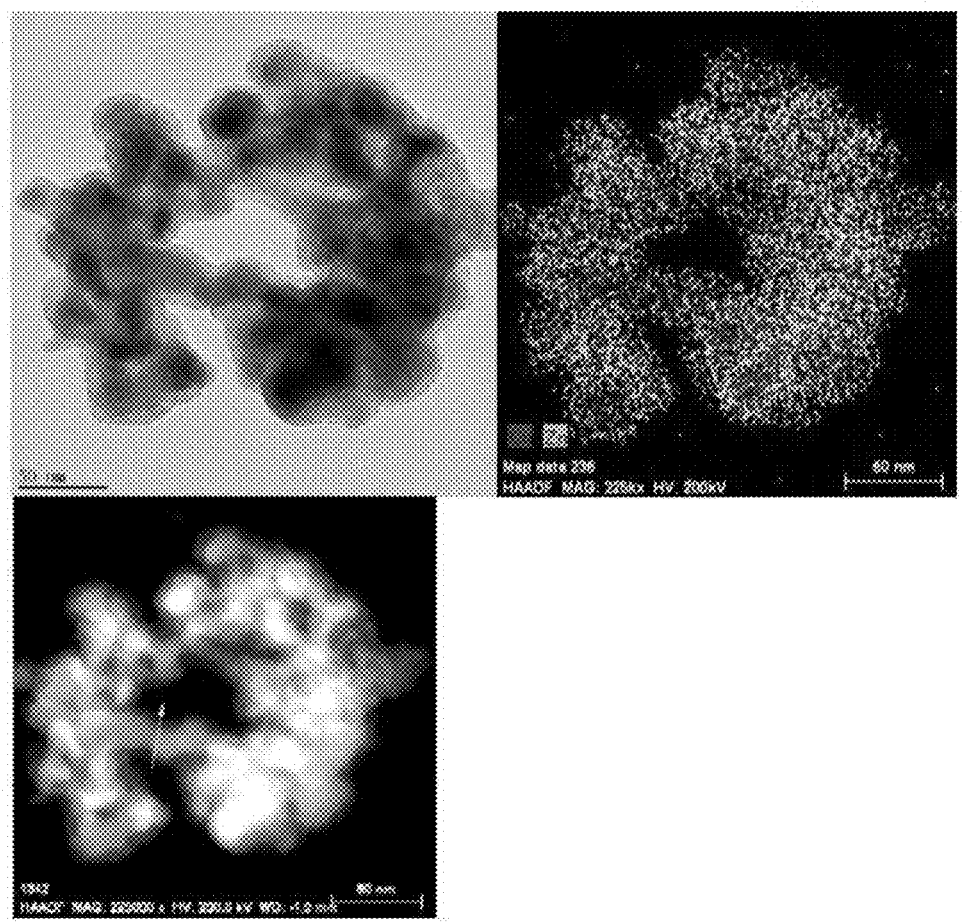

[FIG. 4]
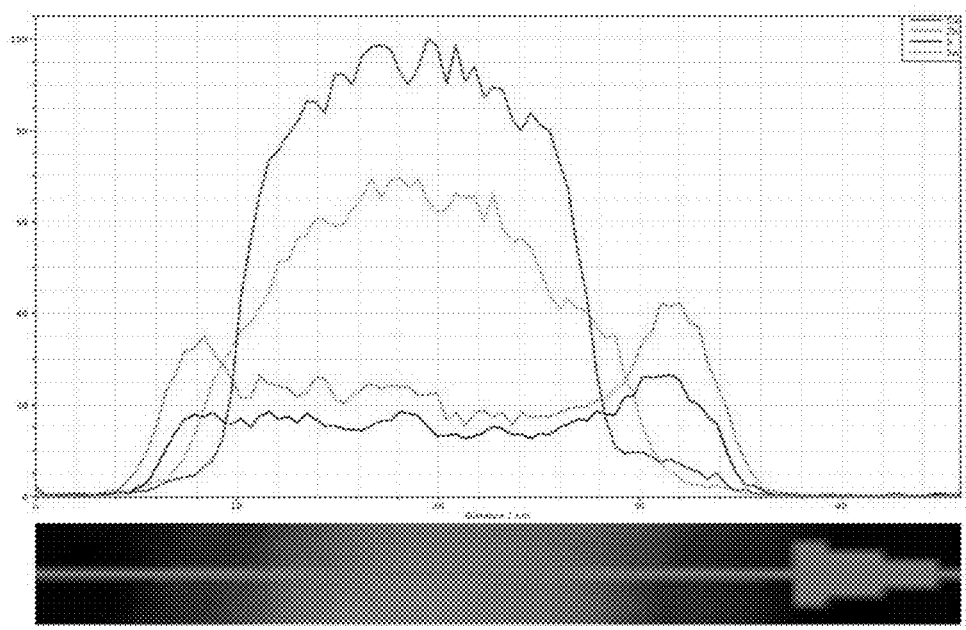
[FIG. 5]
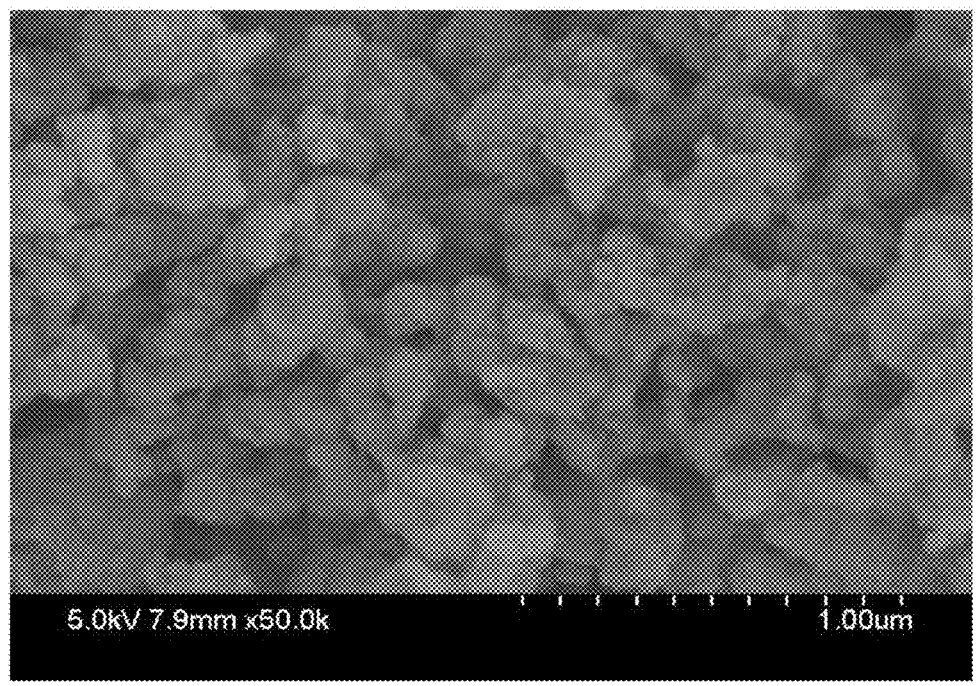

[FIG. 6]
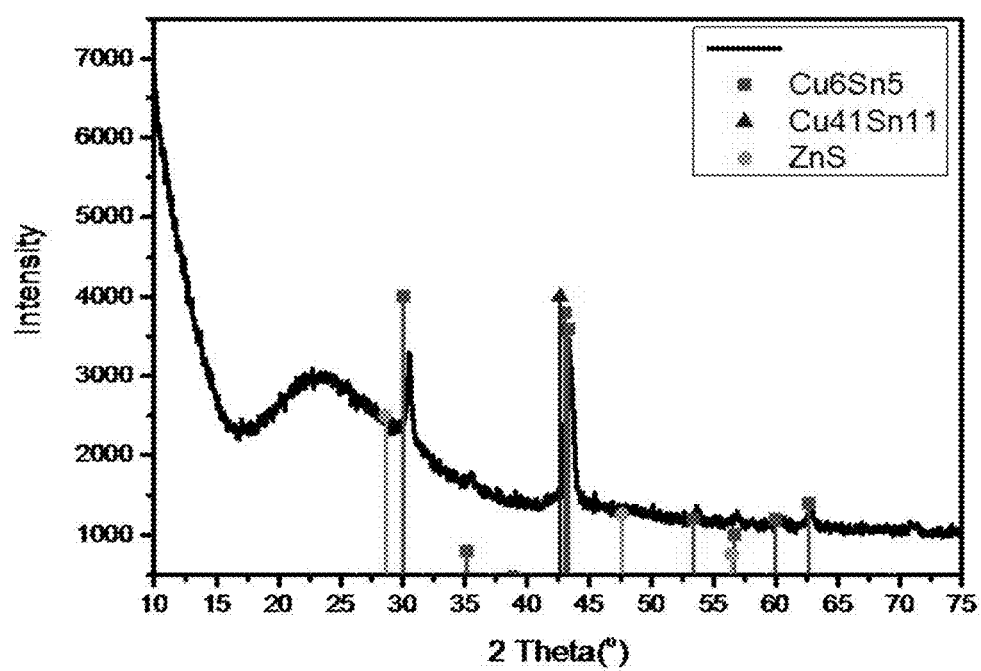

[FIG. 7]
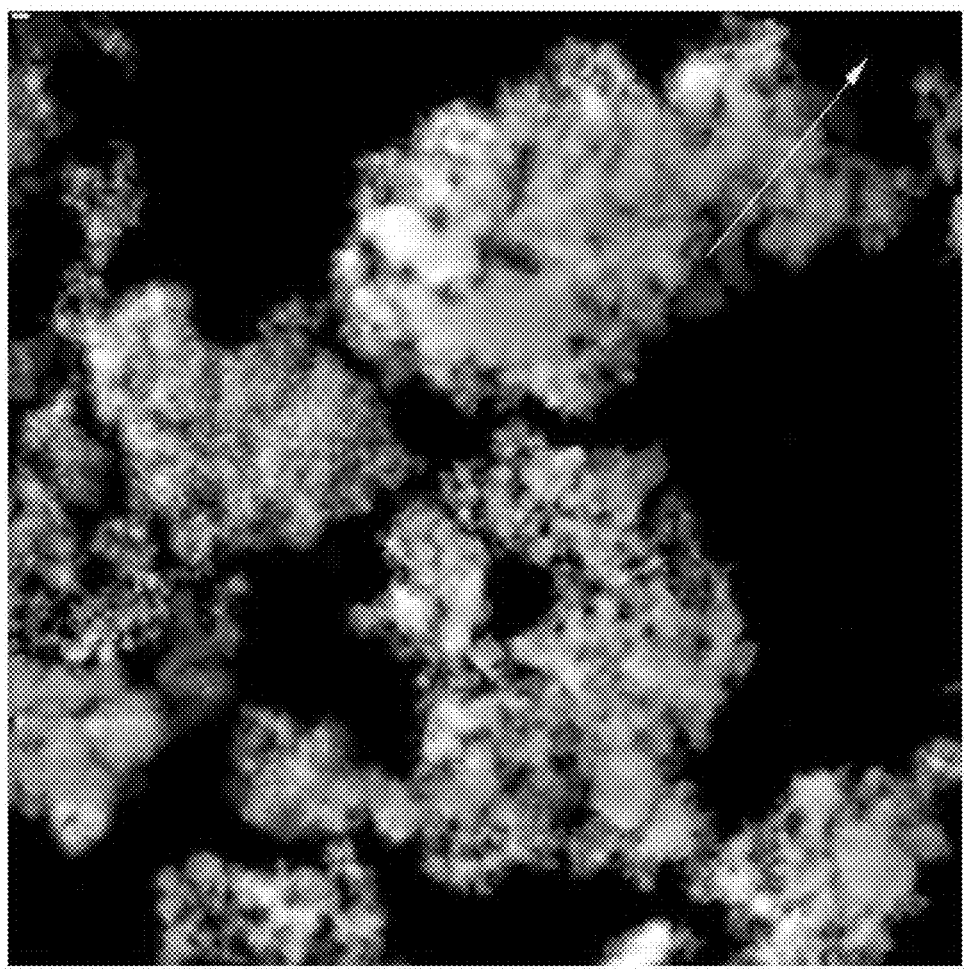

[FIG. 8]
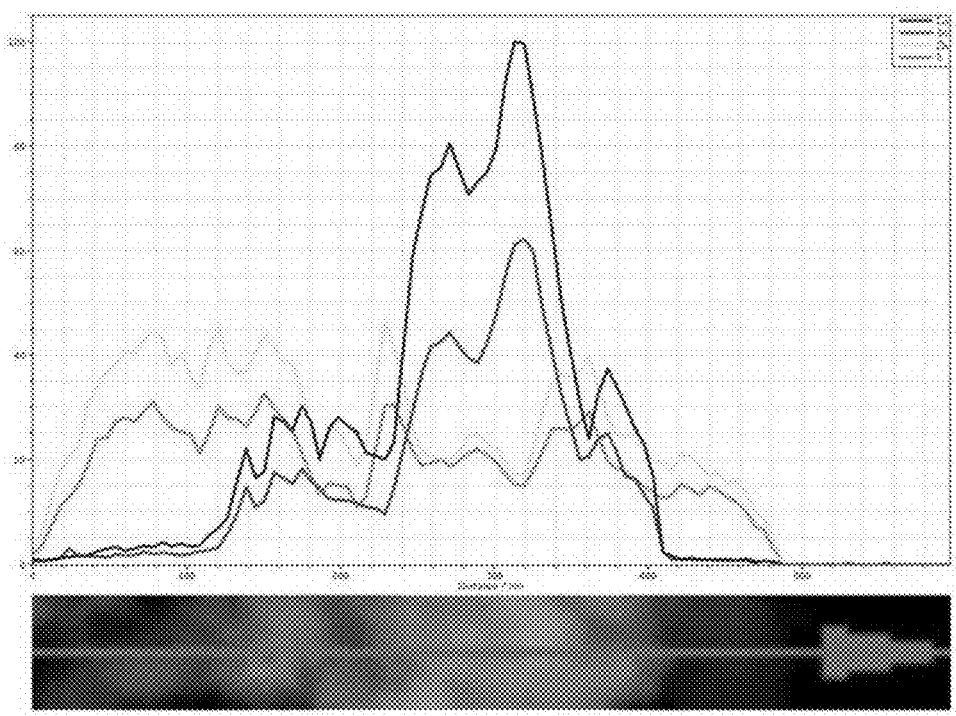

[FIG. 9]
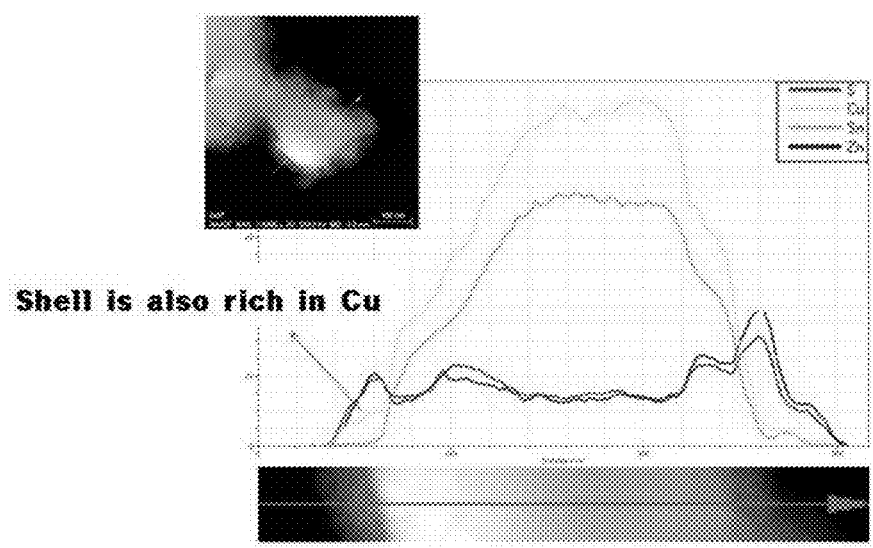
[FIG. 10]
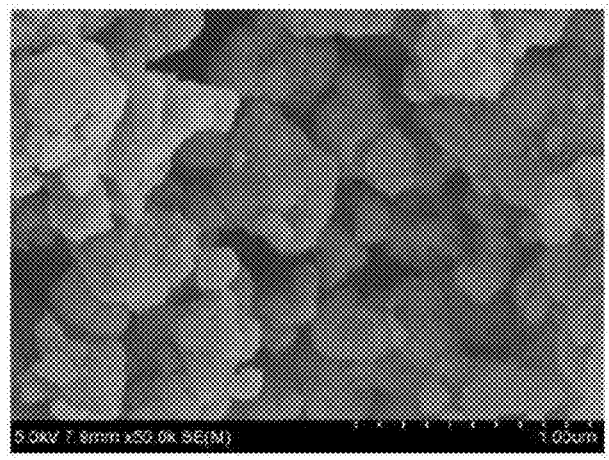

【FIG. 11】
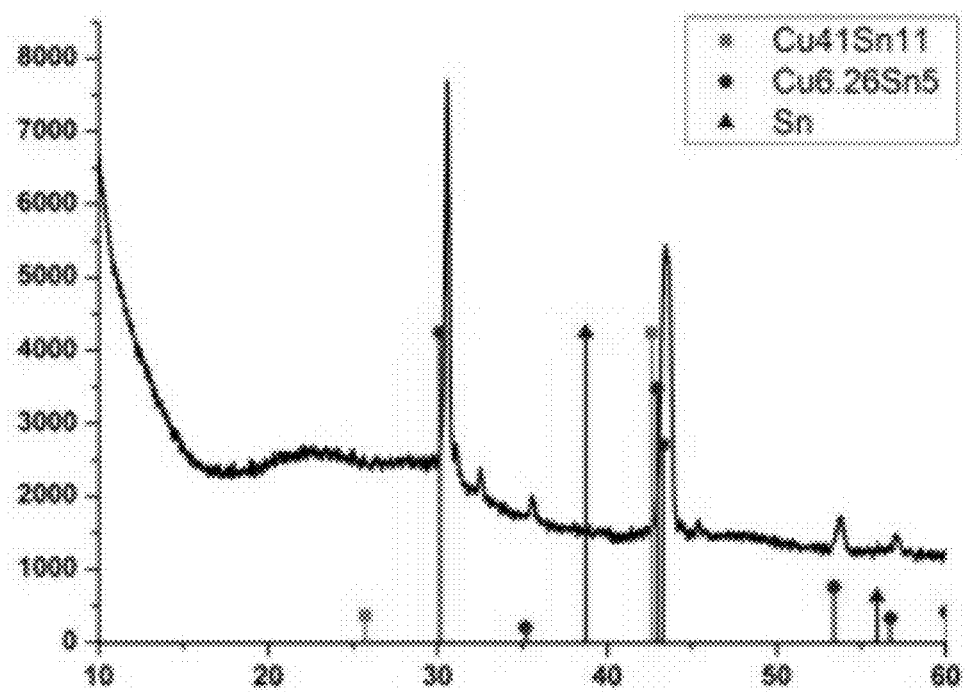
【FIG. 12】
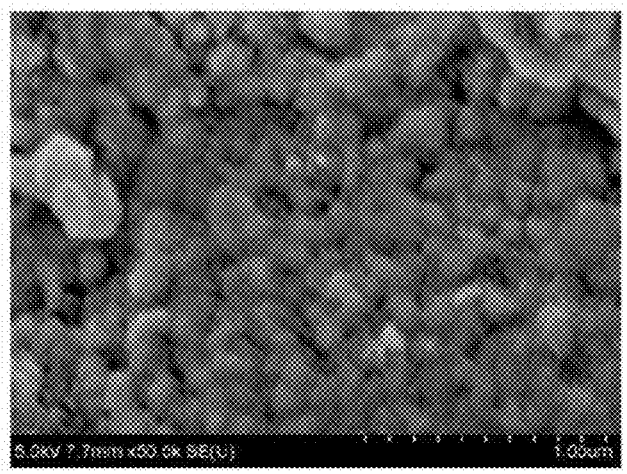

[FIG. 13]
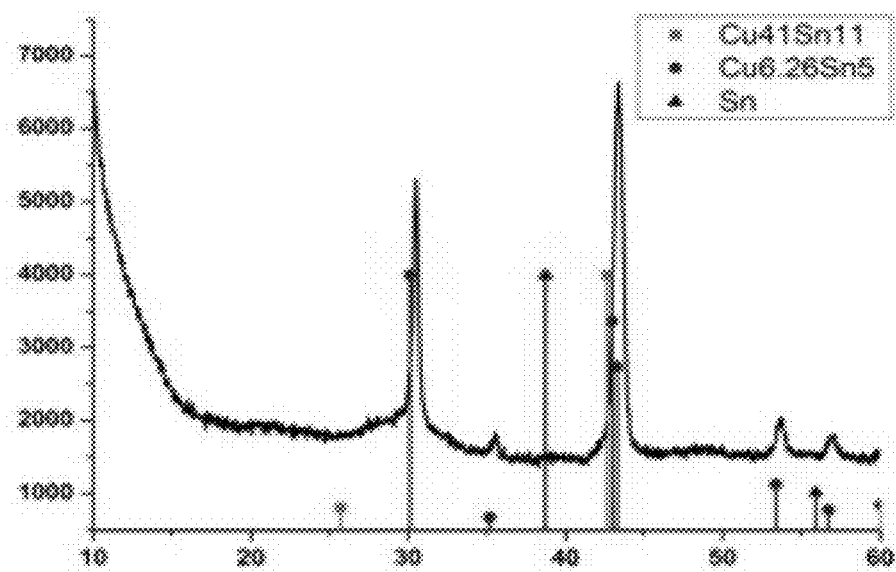
[FIG. 14]
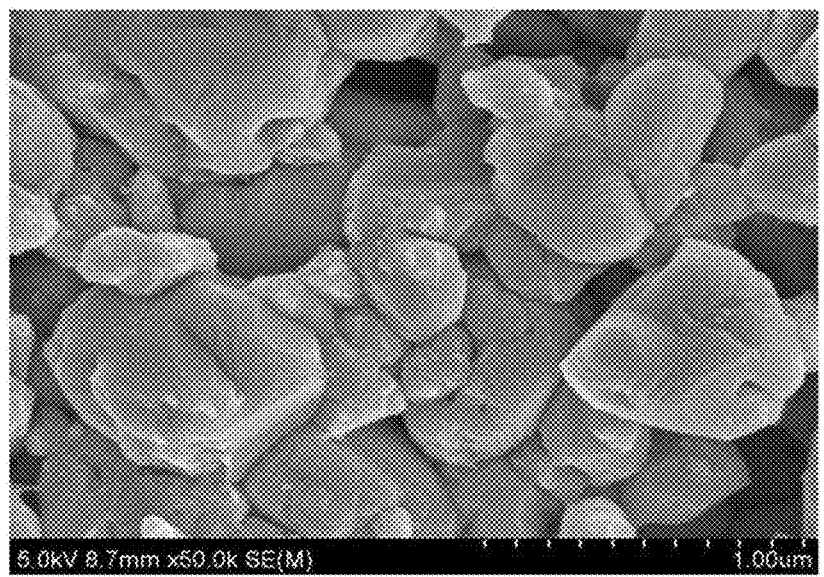

[FIG. 15]
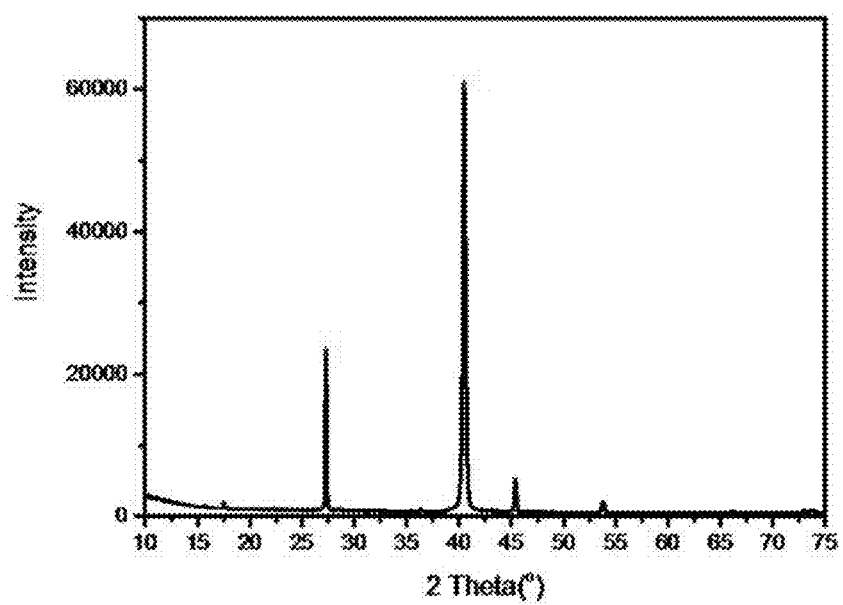
[FIG. 16]
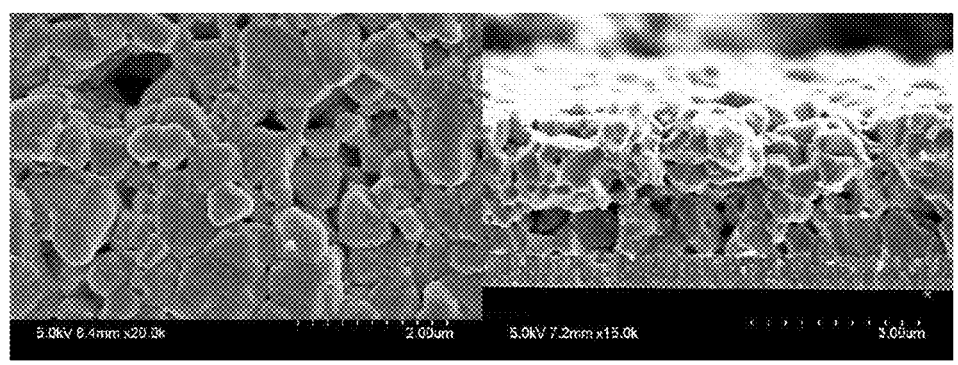

[FIG. 17]
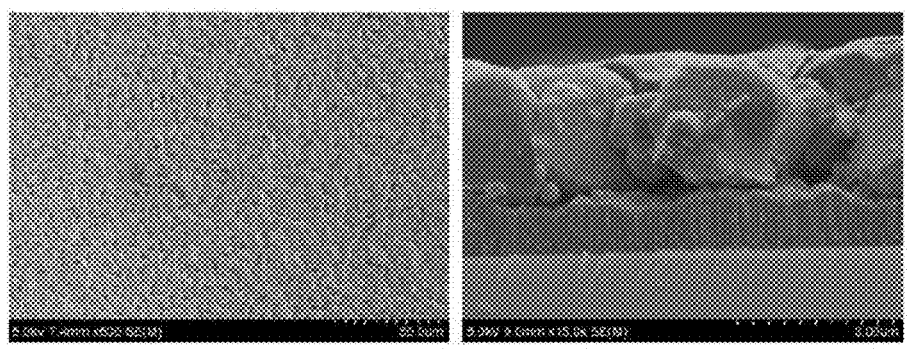
[FIG. 18]
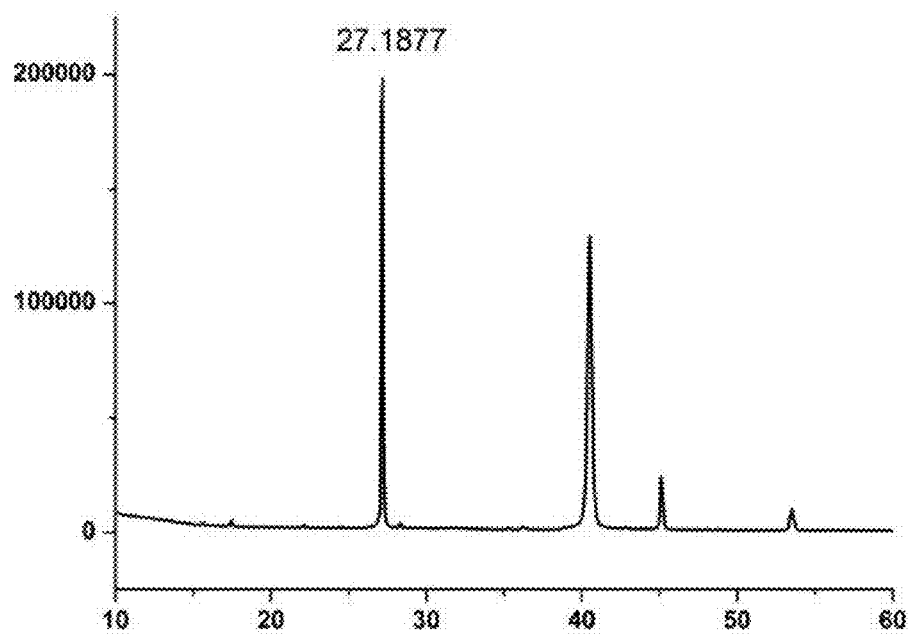

[FIG. 19]
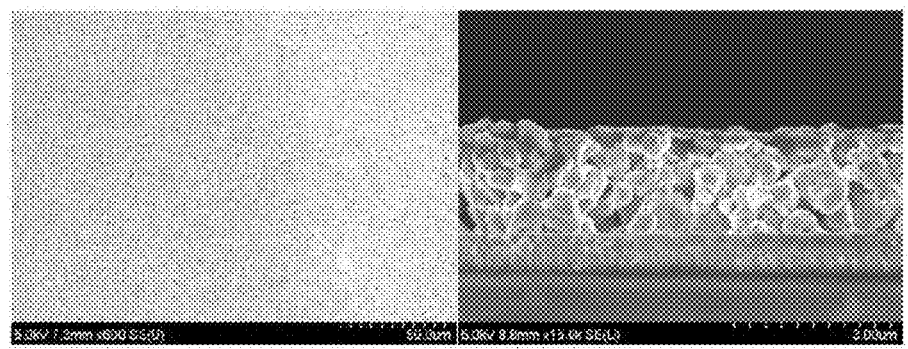
[FIG. 20]
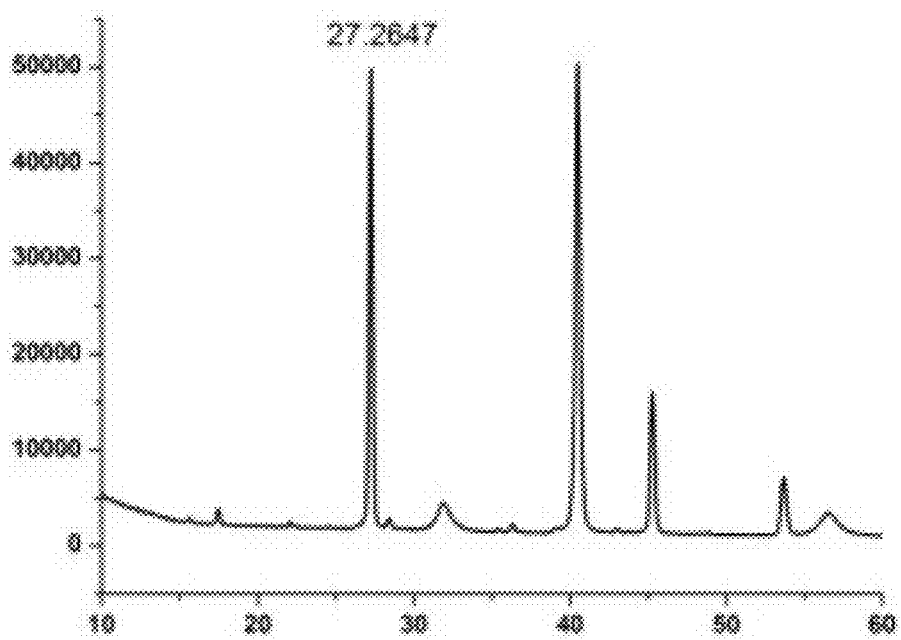

【FIG. 21】
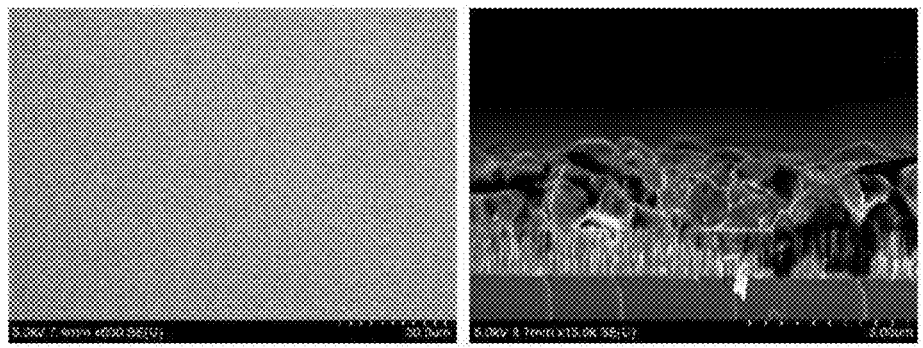
【FIG. 22】
| S K | 6.45 | 6.90 |
|---|---|---|
| Cu K | 20.98 | 20.51 |
| Zn K | 15.06 | 15.33 |
| Se L | 45.80 | 45.56 |
| Sn L | 11.70 | 11.69 |
【FIG. 23】
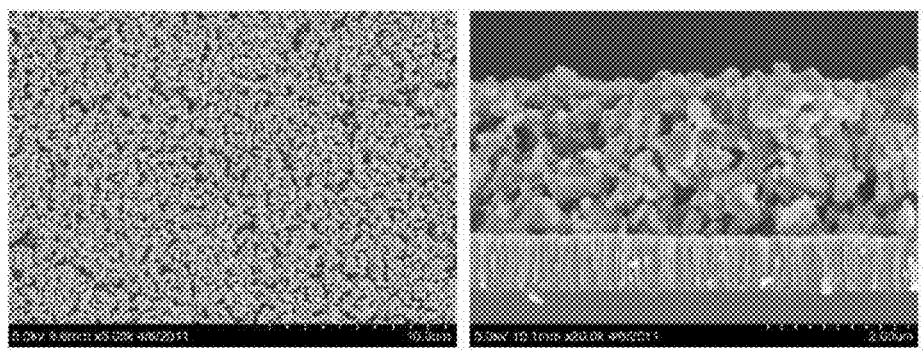

[FIG. 24]

| Element | Weight% | Atomic% |
|---------|---------|---------|
| S K | 14.28 | 15.00 |
| Cu K | 22.56 | 19.38 |
| Zn K | 13.02 | 14.83 |
| Se L | 38.12 | 38.99 |
| Sn L | 12.01 | 11.81 |

[FIG. 25]
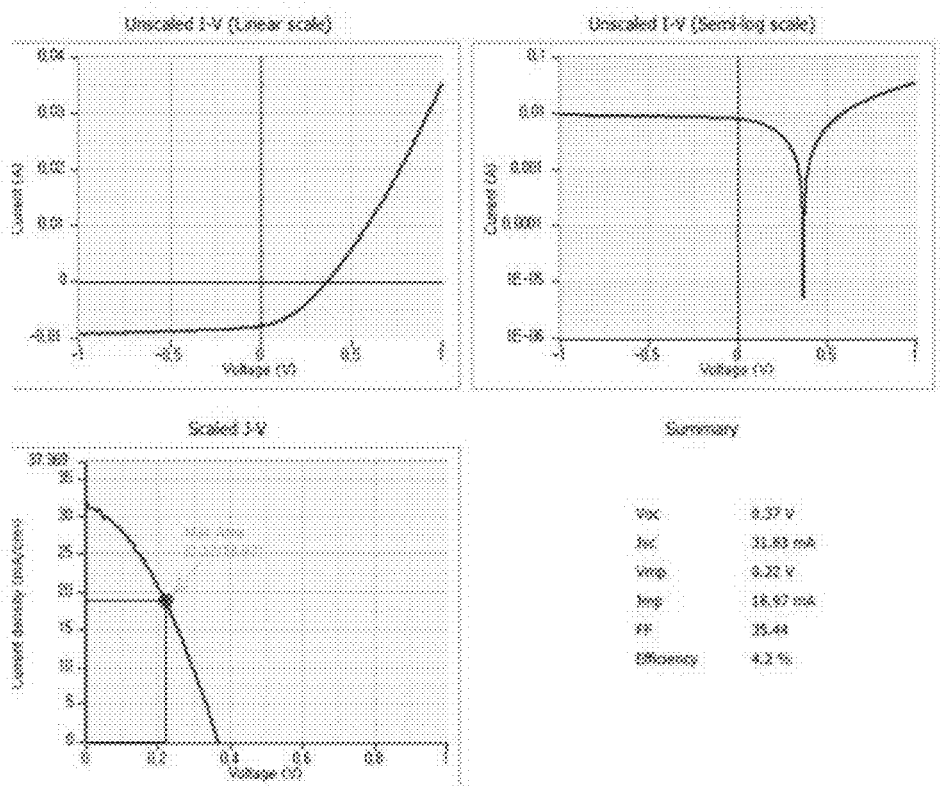

[FIG. 26]
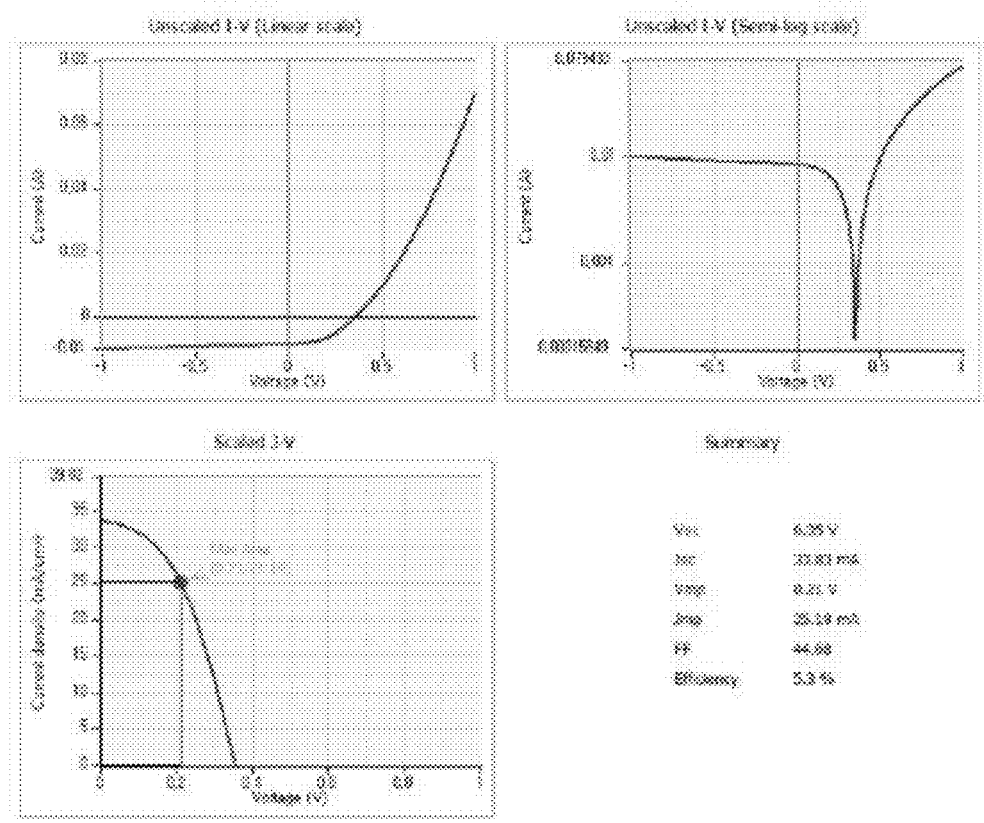

[FIG. 27]
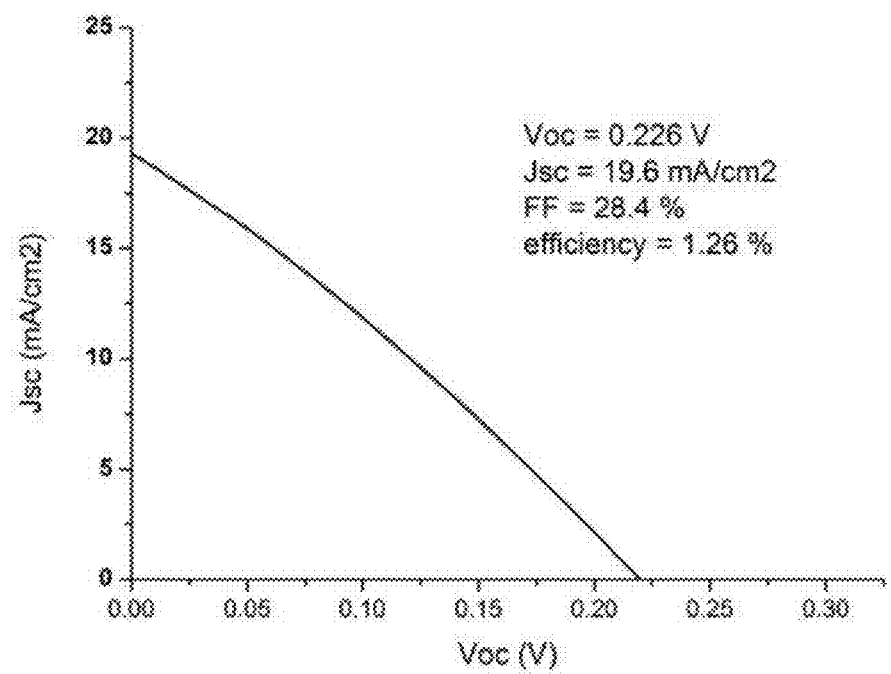

PRECURSOR FOR PREPARING LIGHT ABSORPTION LAYER OF SOLAR CELLS AND METHOD OF PREPARING THE SAME

CROSS-REFERENCE TO RELATED APPLICATION

This application is a National Stage Application of International Application No. PCT/KR2015/011355 filed on Oct. 27, 2015, which claims the benefit of Korean Patent Application No. 10-2014-0152663 filed on Nov. 5, 2014 and Korean Patent Application No. 10-2015-0066497 filed on May 13, 2015, all of which are hereby incorporated by reference in their entirety for all purposes as if fully set forth herein.

TECHNICAL FIELD

The present invention relates to a precursor for preparing a light absorption layer of solar cells and a method of preparing the same.

BACKGROUND ART

Solar cells have been manufactured using a light absorption layer formed at high cost and silicon (Si) as a semiconductor material since an early stage of development. To more economically manufacture industrially applicable solar cells, structures of thin film solar cells, using an inexpensive light absorbing material such as copper indium gallium (di)selenide (CIGS) or $Cu(In, Ga)(S, Se)_2$, have been developed. Such CIGS-based solar cells typically include a rear electrode layer, an n-type junction part, and a p-type light absorption layer. Solar cells including such CIGS layers have a power conversion efficiency of greater than 19%. However, in spite of potential for CIGS-based thin film solar cells, costs and insufficient supply of indium (In) are main obstacles to wide applicability and availability of thin film solar cells using CIGS-based light absorption layers. Thus, there is an urgent need to develop solar cells using In-free or In-less low-cost universal elements.

Accordingly, as an alternative to the CIGS-based light absorption layer, $CZTS(Cu_2ZnSn(S,Se)_4$-based solar cells including copper (Cu), zinc (Zn), tin (Sn), sulfur (S), or selenium (Se), which is an extremely cheap element, have recently received much attention. Advantageously, CZTS has a direct band gap of about 1.0 eV to about 1.5 eV and an absorption coefficient of $10^4$ $cm^{-1}$ or more, reserves thereof are relatively high, and CZTS uses Sn and Zn, which are inexpensive.

CZTS hetero-junction PV batteries were first reported in 1996, but CZTS-based solar cells are technologically less advanced than CIGS-based solar cells and photoelectric efficiency of CZTS-based solar cells is 10% or less which is much lower than that of CIGS-based solar cells. Thin films of CZTS are prepared by sputtering, hybrid sputtering, pulsed laser deposition, spray pyrolysis, electro-deposition/thermal sulfurization, e-beam processing, Cu/Zn/Sn/thermal sulfurization, and a sol-gel method.

Meanwhile, PCT/US/2010-035792 discloses formation of a thin film through heat-treatment of a substrate using ink including CZTS/Se nanoparticles. Generally, when a CZTS thin film is formed with CZTS/Se nanoparticles, it is difficult to enlarge crystal size in the subsequent process of forming a thin film due to previously formed small crystals. As such, when each grain is small, interfaces are extended, causing electron loss at interfaces. Accordingly, efficiency is inevitably deteriorated.

Accordingly, nanoparticles used in a thin film should include Cu, Zn and Sn, and should not be a CZTS crystal type. However, disadvantageously, metal nanoparticles composed of a single metal element may be easily oxidized and require a subsequent additional process for removing oxide at high temperature using a large amount of Se. In addition, when chalcogenides including respective metals are synthesized respectively and used in combination in the process of preparing ink, or used in combination with metal nanoparticles, a non-uniform metal composition ratio may raise a problem and insufficient intermixing between metal nanoparticles having different phases may lead to formation of secondary phases in thin films.

Therefore, there is an increasing need to develop a technology for thin film solar cells including highly efficient light absorption layers that are stable against oxidation, include sufficient amounts of Group VI elements, have an overall more homogenous composition, minimize formation of secondary phases in thin films and have increased film density.

DISCLOSURE

Technical Problem

Therefore, the present invention has been made to solve the above and other technical problems that have yet to be resolved.

As a result of a variety of extensive and intensive studies and experiments, the present inventors developed a precursor for preparing a light absorption layer including: (a) an aggregate-phase composite including a first phase including a copper (Cu)-tin (Sn) bimetallic metal and a second phase including zinc (Zn)-containing chalcogenide, or including the first phase including a copper (Cu)-tin (Sn) bimetallic metal, the second phase including zinc (Zn)-containing chalcogenide and a third phase including copper (Cu)-containing chalcogenide; or (b) core-shell structured nanoparticles including a core including copper (Cu)-tin (Sn) bimetallic metal nanoparticles and a shell including zinc (Zn)-containing chalcogenide, or the zinc (Zn)-containing chalcogenide and copper (Cu)-containing chalcogenide; or (c) a mixture thereof and found that, when a thin film was produced using the precursor, the thin film can have an overall homogeneous composition, can minimize formation of secondary phases therein, is stable against oxidation, and can contain increased amounts of group VI elements owing to S or Se incorporated in the precursor and thus exert high qualities. The present invention has been completed based on these findings.

Technical Solution

In accordance with one aspect of the present invention, provided is a precursor for preparing a light absorption layer of solar cells including:

(a) an aggregate-phase composite including a first phase including a copper (Cu)-tin (Sn) bimetallic metal and a second phase including zinc (Zn)-containing chalcogenide, or including the first phase including a copper (Cu)-tin (Sn) bimetallic metal, the second phase including zinc (Zn)-containing chalcogenide and a third phase including copper (Cu)-containing chalcogenide; or (b) core-shell structured nanoparticles including a core including copper (Cu)-tin (Sn) bimetallic metal nanoparticles and a shell including zinc (Zn)-containingchalcogenide, or the zinc (Zn)-containing chalcogenide and copper (Cu)-containing chalcogenide; or (c) a mixture thereof.

More specifically, the precursor for preparing a light absorption layer of solar cells according to the present invention may include core-shell structured nanoparticles which include a core including copper (Cu)-tin (Sn) bimetallic metal nanoparticles and a shell including zinc (Zn)-containing chalcogenide, or the zinc (Zn)-containing chalcogenide and copper (Cu)-containing chalcogenide.

More preferably, the core-shell structured nanoparticles are stable against oxidization so that formation of oxide can be minimized on grain surfaces and reactivity can thus be improved upon formation of thin films, because copper (Cu), tin (Sn) and zinc (Zn) metals are further homogeneously mixed and the core including the copper (Cu)-tin (Sn) bimetallic metal is protected by the shell including the zinc (Zn)-containing chalcogenide. Furthermore, preferably, the shell further includes copper (Cu)-containing chalcogenide, because uniformity of elements distributed in particles can be increased and the ratio of Cu/Sn contained in the core, based on the amount of Cu contained in the whole particles, can be reduced so that formation of secondary phases can be further minimized upon heat treatment.

Specifically, comparing with the fact that the ratio of Cu/Sn contained in the core, based on the amount of Cu contained in the entire particles, is 1.7 to 2.1, when the shell does not include copper (Cu)-containing chalcogenide, the ratio of Cu/Sn contained in the core, based on the amount of Cu contained in the entire particles, when the shell includes copper (Cu)-containing chalcogenide, is decreased to about 1.2 to about 1.6. As a result, formation of secondary phases can be further minimized upon heat treatment and deficient amount of Cu can be reinforced by controlling the content of the copper (Cu)-containing chalcogenide in the shell.

In a specific embodiment, the Cu—Sn bimetallic metal means an alloy of Cu and Sn, is not limited so long as it has a Cu/Sn ratio (on a mole basis) of 1 or more and, for example, includes one or more selected from the group consisting of CuSn, $Cu_3Sn$, $Cu_{3.02}Sn_{0.98}$, $Cu_{10}Sn_3$, $Cu_{6.26}Sn_5$, $Cu_6Sn_5$, and $Cu_{41}Sn_{11}$.

In a specific embodiment, "chalcogenide" means a substance including a Group VI element, for example, sulfur (S) and/or selenium (Se), the zinc (Zn)-containing chalcogenide may include one or more selected from the group consisting of ZnS and ZnSe, and the copper (Cu)-containing chalcogenide may include one or more selected from the group consisting of $Cu_xS_y$ and $Cu_xSe_y$ (in which $0<x\le1$, $0<y\le2$) and may specifically be CuS or CuSe.

Accordingly, in the second and third phases of the aggregate-phase composite, or the shell of core-shell structured nanoparticles, a Cu/Zn ratio (on a mole basis) of Zn and Cu respectively contained in the zinc (Zn)-containing chalcogenide and the copper (Cu)-containing chalcogenide can be changed depending on the ratio of Cu/Sn of the core, but may specifically be $0\le Cu/Zn\le20$, more specifically $0\le Cu/Zn\le2$.

In this case, a case where the ratio of Cu/Zn is 0 means that the aggregate-phase composite does not include a third phase or the shell of the core-shell structured nanoparticles does not include copper (Cu)-containing chalcogenide. In a case where the composition of the metal is not within the range, there is an excessive difference from the composition ratio enabling formation of CZTS(e) and excess secondary phases such as ZnS, ZnSe, CuS, CuSe and/or $Cu_2SnS$ (e) are thus formed, disadvantageously causing deterioration in photoelectric properties.

Meanwhile, as used herein, the term "aggregate-phase composite" means a unit composed of particles including a first phase, particles including a second phase and particles including a third phase which homogeneously aggregate with one another.

Accordingly, the first phase, second phase and third phase of the aggregate-phase composite may be independently present in a single composite. In this case, morphology of the composite is not limited and can be variable. In a specific embodiment, the first phase, the second phase and the third phase may be randomly distributed to constitute respective regions.

The aggregate-phase composite may have a larger particle size than that of the particle including each phase, because it has a structure in which particles including each phase aggregate with one another, as described above. In a specific embodiment, the aggregate-phase composite may have a particle size of 5 nanometers to 500 nanometers.

On the other hand, as another embodiment of the precursor for preparing a light absorption layer of solar cells according to the present invention, each of core-shell structured nanoparticles is a single nanoparticle having a structure in which a Cu—Sn bimetallic metal nanoparticle is coated with zinc (Zn)-containing chalcogenide, or the zinc (Zn)-containing chalcogenide and copper (Cu)-containing chalcogenide. In this case, the core-shell structured nanoparticle may have a particle size of 2 nanometers to 200 nanometers.

The present inventors found that, when thin films are produced using such an aggregate-phase composite or core-shell structured nanoparticle as a precursor, in any case of them, metals and chalcogenide elements are already homogeneously mixed in the synthesis step, in a case where particles including respective elements are separately synthesized and mixed, the uniformity of the composition can be improved and CZTS with minimized formation of secondary phases can thus be obtained, as compared to in a case where, for example, Cu—Sn bimetallic metal nanoparticles and zinc (Zn) chalcogenide nanoparticles, or zinc (Zn)-containing chalcogenide and copper (Cu)-containing chalcogenide are separately synthesized and then mixed, or copper (Cu) chalcogenide, zinc (Zn) chalcogenide and tin (Sn) chalcogenide nanoparticles are separately synthesized and then mixed.

In this case, in order for CZTS final thin films to exert maximum efficiency, the aggregate-phase composite or core-shell structured nanoparticles may have a metal composition satisfying $0.5\le Cu/(Zn+Sn)\le1.5$ and $0.5\le Zn/Sn\le2$, specifically, $0.7\le Cu/(Zn+Sn)\le1.2$ and $0.7\le Zn/Sn\le1.8$.

When the composition of the metal is not within the range defined above, a great amount of secondary phases are formed and present as impurities, disadvantageously causing deterioration in photoelectric efficiency.

In addition, the ratio of the chalcogenide element in the zinc (Zn)-containing chalcogenide and the copper (Cu)-containing chalcogenide may be 0.5 to 3 moles, with respect to 1 mole of zinc (Zn) or copper (Cu).

When the ratio of the chalcogenide elements is not within the range and is, for example, lower than 0.5 moles, sufficient Group VI elements cannot be supplied and films that are partially deficient in Group VI elements can be formed and when the ratio exceeds 3 moles, thin films may non-uniformly grow due to non-uniformly distribution of Group VI elements in the thin films and the Group VI source evaporates during heat treatment for producing thin films, disadvantageously causing excess pores to be created in final thin films.

The precursor for preparing a light absorption layer can be prepared by a process including:

(i) preparing a first solution containing a reducing agent and a second solution including a copper (Cu) salt and a tin (Sn) salt;

(ii) reacting the first solution with the second solution by mixing to synthesize copper (Cu)-tin (Sn) bimetallic metal nanoparticles; and (iii) reacting a dispersion of the Cu—Sn bimetallic metal nanoparticles of step (ii) with a zinc (Zn)-ligand complex by mixing.

In addition, the process may further include, after step (iii), adding a copper (Cu) salt to the reaction product of step (iii), synthesizing a precursor for preparing a light absorption layer through Zn—Cu substitution reaction and purifying the precursor.

As described above, a zinc (Zn)-ligand complex is preferably used in terms of uniform composition of entire particles and economic efficiency, because the zinc (Zn)-containing chalcogenide phase can be introduced, without a third solution including a Group VI source and a fourth solution including a zinc (Zn) salt.

In a specific embodiment, there is no limitation as to the ligand contained in the ligand complex so long as it is useful as a source of Group VI elements and the ligand for example includes one or more selected from the following compounds:

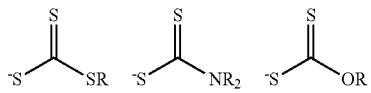

The number of ligands linked to Zn in the zinc (Zn)-ligand complex is not particularly limited and is for example 1 to 4, and the kind of ligands linked to Zn may be one or more.

In addition, the precursor for preparing a light absorption layer may be prepared by a process including:

(i) preparing a first solution containing a reducing agent and a second solution including a copper (Cu) salt and a tin (Sn) salt;

(ii) reacting the first solution with the second solution by mixing to synthesize copper (Cu)-tin (Sn) bimetallic metal nanoparticles;

(iii) preparing a third solution including one or more Group VI sources selected from the group consisting of sulfur (S), selenium (Se), a sulfur (S)-containing compound and a selenium (Se)-containing compound, and a fourth solution including a zinc (Zn) salt; and (iv) reacting the third solution and the fourth solution with a dispersion of the Cu—Sn bimetallic metal nanoparticles of step (ii) by mixing to synthesize a precursor for preparing a light absorption layer and then purifying the precursor.

In addition, the process may further include, after step (iv), adding a copper (Cu) salt to the reaction product of step (iv), synthesizing a precursor for preparing a light absorption layer by Zn—Cu substitution reaction and purifying the precursor.

Here, the Zn—Cu substitution reaction refers to a reaction where a part of the zinc (Zn)-containing chalcogenide is substituted by copper (Cu)-containing chalcogenide by a difference in reduction potential between zinc (Zn) and copper (Cu).

Cu is incorporated in the third phase or shell of the precursor for preparing a light absorption layer through the substitution reaction, thereby reducing the ratio of Cu/Sn contained in the core, based on the amount of Cu contained in the entire particles and further suppressing formation of secondary phases, as described above.

The precursor produced as such involves continuously mixing of first to fourth solutions and can be synthesized in the form of (a) an aggregate-phase composite including a first phase including a copper (Cu)-tin (Sn) bimetallic metal and a second phase including zinc (Zn)-containing chalcogenide, or including the first phase including a copper (Cu)-tin (Sn) bimetallic metal, the second phase including zinc (Zn)-containing chalcogenide and a third phase including copper (Cu)-containing chalcogenide; or (b) core-shell structured nanoparticles including a core including copper (Cu)-tin (Sn) bimetallic metal nanoparticles and a shell including zinc (Zn)-containing chalcogenide, or the zinc (Zn)-containing chalcogenide and copper (Cu)-containing chalcogenide; or (c) a mixture thereof, as described above, instead of being synthesized in the form of separately independent particles of a Cu—Sn bimetallic metal phase and zinc (Zn)-containing chalcogenide phase.

In this case, the composition can be controlled by reaction conditions such as reaction temperature, reaction concentration, reaction time and the type of capping agent, and the uniformity of the composition and particle size of the aggregate-phase composite or core-shell structured nanoparticles can be secured by controlling equivalence ratio of the solutions, the content of the copper (Cu) salt or ligand complex, dropwise addition rate, stirring rate, reaction temperature after mixing, reaction time, the type of capping agent and the like, when mixing the first solution with the second solution, when mixing the dispersion of the Cu—Sn bimetallic metal nanoparticles with the zinc (Zn)-ligand complex or the third solution and the fourth solution, and when conducting Zn—Cu substitution reaction.

Meanwhile, when mixing the first solution with the second solution to prepare a mixture, a mix ratio of the total amount of the salt to the reducing agent is for example 1:1 to 1:20, on a mole basis.

When the reducing agent content is excessively low with respect to the content of the salt, reduction of the metal salt cannot sufficiently occur, only excessively small size or little amount of bimetallic metal nanoparticles can be obtained, or it is difficult to obtain particles with the desired element ratio. In addition, when the content of the reducing agent exceeds 20 times the content of the salt, disadvantageously, it is not easy to remove reducing agent and by-products during purification.

In a specific embodiment, the reducing agent contained in the first solution may be an organic reducing agent and/or an inorganic reducing agent, and may specifically be any one selected from the group consisting of $LiBH_4$, $NaBH_4$, $KBH_4$, $Ca(BH_4)_2$, $Mg(BH_4)_2$, $LiB(Et)_3H$, $NaBH_3(CN)$, $NaBH(OAc)_3$, $N_2H_4$, ascorbic acid and triethanolamine.

In a specific embodiment, the solvent of the first to fourth solutions is not limited, and includes one or more selected from the group consisting of water, alcohol, diethylene glycol, oleylamine, ethylene glycol, triethylene glycol, dimethyl sulfoxide, dimethyl formamide and N-methyl-2-pyrrolidone (NMP), and the alcohol solvent may specifically be C1-C8 alcohol, for example, methanol, ethanol, propanol, butanol, pentanol, hexanol, heptanol or octanol.

In a specific embodiment, the salts of the copper (Cu) salt, the tin (Sn) salt, and the zinc (Zn) salt may include each independently one or more selected from the group consisting of fluoride, chloride, bromide, iodide, nitrate, nitrite, sulfate, acetate, citrate, sulfite, acetylacetonate, acrylate, cyanide, phosphate and hydroxide. Any tin (Sn) salt may be used without limitation to bivalent and tetravalent salts.

In a specific embodiment, the Group VI source may include one or more selected from the group consisting of Se, $Na_2Se$, $K_2Se$, CaSe, $(CH_3)_2Se$, $SeO_2$, $SeS_2$, $Se_2S_6$, $Se_2Cl_2$, $Se_2Br_2$, $SeCl_4$, $SeBr_4$, $SeOCl_2$, $H_2SeO_3$, $H_2SeO_4$, S, $Na_2S$, $K_2S$, CaS, $(CH_3)_2S$, $H_2SO_4$, $Na_2S_2O_3$, and $NH_2SO_3H$, hydrates thereof, $HSCH_2COOH$, thiolactic acid, mercaptoethanol, aminoethanethiol, thiourea, thioacetamide, and selenourea.

Meanwhile, one or more of the first to fourth solutions may further include a capping agent. If necessary, the capping agent may be separately added in the preparation process.

The capping agent is incorporated during solution process, thereby controlling the size and particle phase of the synthesized metal nanoparticles and precursor for preparing a light absorption layer. The capping agent includes atoms such as N, O and S and is thus easily bound to metal nanoparticle surfaces through lone pair electrons of these atoms to surround the nanoparticle surfaces, thereby preventing oxidation of metal nanoparticles.

There is no particular limitation as to the capping agent. For example, the capping agent may include one or more selected from the group consisting of sodium L-tartrate dibasic dehydrate, potassium sodium tartrate, sodium acrylate, poly(acrylic acid sodium salt), poly(vinyl pyrrolidone) (PVP), sodium citrate, trisodium citrate, disodium citrate, sodium gluconate, sodium ascorbate, sorbitol, triethyl phosphate, ethylene diamine, propylene diamine, 1,2-ethanedithiol, ethanethiol, aminoethanethiol, mercaptoethanol, mercaptopropionic acid (MPA), polyvinylalcohol (PVA) and ethyl cellulose.

The capping agent may be suitably present in the solvent, for example, in an amount of 20 moles or less, with respect to 1 mole of the total salt.

When the content of the capping agent exceeds 20 times that of the total salt, disadvantageously, it is difficult to purify the precursor and purity is deteriorated.

In addition, the present invention provides an ink composition for preparing a light absorption layer including the precursor for preparing a light absorption layer dispersed in the solvent, and a method of producing a thin film using the precursor for preparing a light absorption layer.

The method of producing a thin film according to the present invention includes: (i) dispersing, in a solvent, a precursor for preparing a light absorption layer including: (a) an aggregate-phase composite including a first phase including a copper (Cu)-tin (Sn) bimetallic metal and a second phase including zinc (Zn)-containing chalcogenide, or including the first phase including a copper (Cu)-tin (Sn) bimetallic metal, the second phase including zinc (Zn)-containing chalcogenide and a third phase including copper (Cu)-containing chalcogenide; or (b) core-shell structured nanoparticles including a core including copper (Cu)-tin (Sn) bimetallic metal nanoparticles and a shell including zinc (Zn)-containing chalcogenide, or the zinc (Zn)-containing chalcogenide and copper (Cu)-containing chalcogenide; or (c) a mixture thereof to prepare an ink; (ii) coating a substrate provided with an electrode with the ink; and (iii) drying the ink coated on the substrate provided with an electrode, and conducting heat treatment.

As such, when the thin film is produced using the precursor according to the present invention, the precursor synthesized from already homogeneously mixed elements is used, so that the thin film can have an overall more uniform composition, formation of secondary phases can be minimized, a highly dense light absorption layer can be grown based on an increased volume of the precursor due to additional Group VI elements incorporated during heat treatment of step (iii) through the first phase or core composed of bimetallic metals, and high-quality final thin films with an increased content of Group VI element can be produced owing to the second phase or shell including S or Se.

In a specific embodiment, the solvent of step (i) may be used without particular limitation so long as it is a generally used organic solvent. The solvent may be an organic solvent selected from alkane, alkene, alkyne, aromatic, ketone, nitrile, ether, ester, organic halide, alcohol, amine, thiol, carboxylic acid, phosphine, phosphite, phosphates, sulfoxide and amide, or a combination thereof.

Specifically, the alcohol solvent may be at least one mixed solvent selected from ethanol, 1-propanol, 2-propanol, 1-pentanol, 2-pentanol, 1-hexanol, 2-hexanol, 3-hexanol, heptanol, octanol, ethylene glycol (EG), diethylene glycol monoethyl ether (DEGMEE), ethylene glycol monomethyl ether (EGMME), ethylene glycol monoethyl ether (EGMEE), ethylene glycol dimethyl ether (EGDME), ethylene glycol diethyl ether (EGDEE), ethylene glycol monopropyl ether (EGMPE), ethylene glycol monobutyl ether (EGMBE), 2-methyl-1-propanol, cyclopentanol, cyclohexanol, propylene glycol propyl ether (PGPE), diethylene glycol dimethyl ether (DEGDME), 1,2-propanediol (1,2-PD), 1,3-propanediol (1,3-PD), 1,4-butanediol (1,4-BD), 1,3-butanediol (1,3-BD), α-terpineol, diethylene glycol (DEG), glycerol, 2-(ethylamino)ethanol, 2-(methylamino)ethanol, and 2-amino-2-methyl-1-propanol.

The amine solvent may be at least one mixed solvent selected from triethylamine, dibutyl amine, dipropyl amine, butylamine, ethanolamine, diethylenetriamine (DETA), triethylenetetramine (TETA), triethanolamine, 2-aminoethyl piperazine, 2-hydroxyethyl piperazine, dibutylamine, and tris(2-aminoethyl)amine.

The thiol solvent may be at least one mixed solvent selected from 1,2-ethanedithiol, pentanethiol, hexanethiol, and mercaptoethanol.

The alkane solvent may be at least one mixed solvent selected from hexane, heptane and octane.

The aromatic solvent may be at least one mixed solvent selected from toluene, xylene, nitrobenzene and pyridine.

The organic halide solvent may be at least one mixed solvent selected from chloroform, methylene chloride, tetrachloromethane, dichloroethane, and chlorobenzene.

The nitrile solvent may be acetonitrile.

The ketone solvent may be at least one mixed solvent selected from acetone, cyclohexanone, cyclopentanone, and acetyl acetone.

The ether solvent may be at least one mixed solvent selected from ethyl ether, tetrahydrofuran, and 1,4-dioxane.

The sulfoxide solvent may be at least one mixed solvent selected from dimethyl sulfoxide (DMSO) and sulfolane.

The amide solvent may be at least one mixed solvent selected from dimethyl formamide (DMF) and n-methyl-2-pyrrolidone (NMP).

The ester solvent may be at least one mixed solvent selected from ethyl lactate, γ-butyrolactone and ethyl acetoacetate.

The carboxylic acid solvent may be at least one mixed solvent selected from propionic acid, hexanoic acid, meso-2,3-dimercaptosuccinic acid, thiolactic acid and thioglycolic acid.

However, the solvents are given as examples and the present invention is not limited thereto.

If necessary, an additive may be further added to the ink of step (i).

The additive may, for example, include at least one selected from the group consisting of a dispersant, a surfactant, a polymer, a binder, a crosslinking agent, an emulsifying agent, an anti-foaming agent, a drying agent, a filler, a bulking agent, a thickening agent, a film conditioning agent, an antioxidant, a fluidizer, a leveling agent, and a corrosion inhibitor. In particular, the additive may include at least one selected from the group consisting of polyvinylpyrrolidone (PVP), polyvinyl alcohol (PVA), Anti-terra 204, Anti-terra 205, ethyl cellulose, and DispersBYK110.

For example, the method of forming the coating layer of step (ii) may include one or more selected from the group consisting of wet coating, spray coating, spin-coating, doctor blade coating, contact printing, top feed reverse printing, bottom feed reverse printing, nozzle feed reverse printing, gravure printing, micro gravure printing, reverse micro gravure printing, roller coating, slot die coating, capillary coating, inkjet-printing, jet deposition, and spray deposition.

The heat-treatment of step (iii) may be carried out at a temperature of 400 to 900° C.

Meanwhile, the method may optionally include selenization in order to prepare a thin film of a solar cell with a high density. The selenization may be carried out through a variety of methods.

In the first example, the selenization may be carried out by dispersing S and/or Se in the form of a particle in a solvent together with the precursor of step (i) to prepare an ink and conducting the heat treatment of step (iii).

In the second example, the selenization may be carried out by conducting the heat treatment of step (iii) in the presence of S or Se.

More specifically, the presence of S or Se can be achieved by supplying $H_2S$ or $H_2Se$ gas or supplying Se or S gas through heating.

In the third example, the selenization may be carried out by, after step (ii), laminating S or Se, followed by conducting step (iii). More specifically, the lamination may be performed by a solution process or a deposition method.

In addition, the present invention provides a thin film produced by the method.

The thin film may have a thickness of 0.5 μm to 3.0 μm, more specifically, 0.5 μm to 2.5 μm.

When the thickness of the thin film is less than 0.5 μm, desired photoelectric efficiency cannot be obtained due to insufficient density and amount of the light absorption layer, and when the thickness of the thin film exceeds 3.0 μm, as movement distances of carriers increase, a chance of leading to recombination is increased and deterioration in efficiency thus occurs.

Furthermore, the present invention provides a thin film solar cell produced using the thin film.

A method of producing the thin film solar cell is well-known to those skilled in the art and detailed explanation thereof is thus omitted.

BRIEF DESCRIPTION OF THE DRAWINGS

The above and other objects, features and other advantages of the present invention will be more clearly understood from the following detailed description taken in conjunction with the accompanying drawings, in which:

FIG. 1 is an SEM image of a precursor for preparing a light absorption layer according to Example 1;

FIG. 2 is an XRD graph of the precursor for preparing a light absorption layer according to Example 1;

FIG. 3 is a TEM image of a precursor for preparing a light absorption layer according to Example 3;

FIG. 4 is a composition analysis graph using a line scan of the TEM image of FIG. 3;

FIG. 5 is an SEM image of a precursor for preparing a light absorption layer according to Example 11;

FIG. 6 is an XRD graph of the precursor for preparing a light absorption layer according to Example 11;

FIG. 7 is a TEM image of the precursor for preparing a light absorption layer according to Example 11;

FIG. 8 is a composition analysis graph using a line scan of the TEM image of FIG. 7;

FIG. 9 shows a line-scan result of the composition of a precursor for preparing a light absorption layer according to Example 22;

FIG. 10 is an SEM image of the composition of the precursor for preparing a light absorption layer according to Example 22;

FIG. 11 is an XRD graph of the composition of the precursor for preparing a light absorption layer according to Example 22;

FIG. 12 is an SEM image of the composition of a precursor for preparing a light absorption layer according to Example 24;

FIG. 13 is an XRD graph of the composition of the precursor for preparing a light absorption layer according to Example 24;

FIG. 14 is an SEM image of a thin film produced in Example 35;

FIG. 15 is an XRD graph of the thin film produced in Example 35;

FIG. 16 is an SEM image of a cross-sectional shape of a thin film produced in Example 37;

FIG. 17 is an SEM image of a thin film produced in Example 43;

FIG. 18 is an XRD graph of the thin film produced in Example 43;

FIG. 19 is an SEM image of a thin film produced in Example 47;

FIG. 20 is an XRD graph of the thin film produced in Example 47;

FIG. 21 is an SEM image of a thin film produced in Example 48;

FIG. 22 is an EDX table of the thin film produced in Example 48;

FIG. 23 is an SEM image of a thin film produced in Comparative Example 7;

FIG. 24 is an EDX table of the thin film produced in Comparative Example 7;

FIG. 25 is a graph showing properties of a cell produced using the thin film of Example 37 in Test Example 1;

FIG. 26 is a graph showing properties of a cell produced using the thin film of Example 48 in Test Example 1; and FIG. 27 is a graph showing properties of a cell produced using the thin film of Comparative Example 7 in Test Example 1.

BEST MODE

Now, the present invention will be described in more detail with reference to the following examples. These examples are provided only to illustrate the present invention and should not be construed as limiting the scope and spirit of the present invention.

EXAMPLE 1

A tetraethylene glycol mix solution containing 18 mmol of $CuCl_2$ and 10 mmol of $SnCl_2$ was slowly added dropwise to a triethylene glycol mix solution containing 150 mmol of $NaBH_4$, and the mixture was reacted under stirring for 3 hours and then purified to prepare Cu—Sn bimetallic metal nanoparticles including a mixture of $Cu_6Sn_5$ and Cu-rich Cu—Sn($Cu_{41}Sn_{11}$).

A solution of 5 mmol of zinc nitrate in 50 ml of water was added to a dispersion of the Cu—Sn bimetallic metal nanoparticles, followed by stirring for 1 hour. Then, a solution of 10 mmol of $Na_2S$ in 70 ml of distilled water was added dropwise to the stirred solution for 1 hour and the mixture was reacted for 3 hours to prepare a precursor including an aggregate-phase composite composed of $Cu_6Sn_5$, a $Cu_{41}Sn_{11}$ phase and a ZnS phase, and nanoparticles having a structure composed of a Cu—Sn core and a ZnS shell.

The scanning electron microscope (SEM) image and the XRD graph of the formed precursor are shown in FIGS. 1 and 2, respectively.

As can be seen from FIGS. 1 and 2, as a result of XRD analysis, the particles are present as a combination of a Cu—Sn bimetallic phase including a mixture of a $Cu_6Sn_5$ crystal phase and a Cu-rich Cu—Sn crystal phase, with a ZnS crystal phase, or the particles are present as an aggregate-phase composite including uniformly dispersed Cu—Sn and ZnS phases, or core-shell structured nanoparticles including Cu—Sn coated with ZnS.

EXAMPLE 2

An aqueous solution containing 15 mmol of $CuCl_2$ and 10 mmol of $SnCl_2$ was slowly added dropwise at 50° C. to a solution of 150 mmol of $NaBH_4$ in distilled water and the mixture was reacted under stirring for 3 hours to prepare Cu—Sn bimetallic metal nanoparticles including a mixture of $Cu_6Sn_5$ and Cu-rich Cu—Sn, for example, $Cu_3Sn$, $Cu_{10}Sn_3$, or $Cu_{41}Sn_{11}$.

A solution of 11 mmol of zinc acetate in 50 ml of distilled water was added to a dispersion of the Cu—Sn bimetallic metal nanoparticles, followed by stirring for 30 minutes. Then, a solution of 20 mmol of $Na_2S$ in 100 ml of distilled water was added at a time to the stirred solution, and the mixture was reacted for 3 hours to prepare an aggregate-phase composite including a Cu—Sn phase and a ZnS phase.

EXAMPLE 3

A mix solution containing 20 mmol of $CuCl_2$ and 10 mmol of $SnCl_2$ was added dropwise to a DMSO solution containing 150 mmol of $NaBH_4$ at 80° C. for 1 hour, the mixture was reacted under stirring for 24 hours, and the formed particles were purified by centrifugation to prepare Cu—Sn bimetallic metal nanoparticles including a mix phase of $Cu_{6.26}Sn_5$ and $Cu_{10}Sn_3$.

A solution of 1 g of polyvinylpyrrolidone in 50 ml of ethanol was added to a dispersion of the Cu—Sn bimetallic metal nanoparticles in ethanol, followed by stirring for 1 hour. A solution of 12 mmol of zinc acetate in 100 ml of ethanol was added to the stirred mixture, followed by further stirring for 1 hour. A solution of 12 mmol of thiourea in 50 ml of ethanol was slowly added dropwise to the stirred mixture for 1 hour, and the resulting mixture was heated to 50° C. to prepare core-shell structured nanoparticles including Cu—Sn bimetallic particles and a ZnS phase. The transmission electron microscope (TEM) image of the formed precursor and TEM analysis results thereof are shown in FIGS. 3 and 4.

EXAMPLE 4

A mix aqueous solution containing 18 mmol of $CuCl_2$, 10 mmol of $SnCl_2$, and 50 mmol of trisodium citrate was slowly added dropwise to an aqueous solution containing 120 mmol of $NaBH_4$ for 1 hour, the mixture was reacted under stirring for 24 hours, and the formed particles were purified by centrifugation to prepare Cu—Sn bimetallic metal nanoparticles including a mixture of $Cu_6Sn_5$ and $Cu_{41}Sn_{11}$.

After the Cu—Sn bimetallic metal nanoparticles were dispersed in 100 ml of distilled water, an aqueous solution containing 11 mmol of zinc acetate and an aqueous solution containing 12 mmol of NaHSe were sequentially added dropwise to the dispersion to prepare an aggregate-phase composite including a Cu—Sn phase and a ZnSe phase.

EXAMPLE 5

A mix solution containing 20 mmol of $CuCl_2$ and 10 mmol of $SnCl_2$ was added dropwise to a DMSO solution including 80 mmol of $NaBH_4$ over 1 hour, the mixture was reacted under stirring for 24 hours and the formed particles were purified by centrifugation to prepare Cu—Sn bimetallic metal nanoparticles.

After the Cu—Sn bimetallic metal nanoparticles were dispersed in 200 ml of distilled water, a solution of 12 mmol of $ZnCl_2$ and 0.5 g of PVP in 100 ml of distilled water was added dropwise to the dispersion. A solution of $Na_2S$ in distilled water was slowly added dropwise to the resulting mix solution, followed by stirring for 5 hours, to prepare an aggregate-phase composite including a Cu—Sn phase and a ZnS phase.

EXAMPLE 6

A mix aqueous solution containing 16 mmol of CuCl and 10 mmol of $SnCl_4$ was added dropwise to an aqueous solution containing 120 mmol of $NaBH_4$, the mixture was reacted under stirring for 24 hours and the formed particles were purified by centrifugation to prepare Cu—Sn bimetallic metal nanoparticles.

After the Cu—Sn bimetallic metal nanoparticles were dispersed in butoxyethanol, a solution of zinc acetate and thiourea dissolved in concentrations of 11 mmol and 22 mmol, respectively, was added to the dispersion, and the mixture was reacted at 150° C. for 3 hours to prepare an aggregate-phase composite including a Cu—Sn phase and a ZnS phase.

EXAMPLE 7

A mix aqueous solution containing 16 mmol of $CuCl_2$ and 10 mmol of $SnCl_4$ was added dropwise to an aqueous solution containing 120 mmol of $NaBH_4$ over 1 hour, the mixture was reacted under stirring for 24 hours, and the formed particles were purified by centrifugation to prepare Cu—Sn bimetallic metal nanoparticles.

After the Cu—Sn bimetallic metal nanoparticles were dispersed in ethanol, a solution of zinc acetate, ethanedithiol and thioacetamide respectively dissolved in concentrations of 11 mmol, 10 mmol and 22 mmol in 50 ml of ethanol was added to the dispersion, and the mixture was reacted at 150° C. for 3 hours to prepare an aggregate-phase composite including a Cu—Sn phase and a ZnS phase.

EXAMPLE 8

A mix aqueous solution containing 18 mmol of $CuCl_2$ and 10 mmol of $SnCl_2$ was added dropwise to a dimethyl formamide solution containing 120 mmol of $NaBH_4$ over 1 hour, the mixture was reacted under stirring for 24 hours, and the formed particles were purified by centrifugation to prepare Cu—Sn bimetallic metal nanoparticles.

After the Cu—Sn bimetallic metal nanoparticles were dispersed in isopropanol, a solution of $ZnCl_2$ and thioacetamide respectively dissolved in concentrations of 10 mmol and 15 mmol was added to the dispersion, and the mixture was reacted at 80° C. for 3 hours to prepare an aggregate-phase composite including a Cu—Sn phase and a ZnS phase.

EXAMPLE 9

A DMSO solution containing 14 mmol of $Cu(NO_3)_2$ and 10 mmol of $SnCl_4.5H_2O$ was added dropwise to a DMSO solution containing 80 mmol of $NaBH_4$ at 60° C. for 1 hour, the mixture was reacted under stirring for 6 hours and the formed particles were purified by centrifugation to prepare Cu—Sn bimetallic metal nanoparticles.

After the Cu—Sn bimetallic metal nanoparticles were dispersed in 300 mL of ethanol, 15 mmol of zinc ethylxanthate was dissolved in the dispersion, followed by heating to 78° C. and stirring for 3 hours to prepare an aggregate-phase composite including a Cu—Sn phase and a ZnS phase.

EXAMPLE 10

A mix solution containing 14 mmol of $Cu(NO_3)_2$ and 10 mmol of $SnCl_4.5H_2O$ was added dropwise at 90° C. for 1 hour to an NMP solution containing 80 mmol of $NaBH_4$, the mixture was reacted under stirring for 6 hours and the formed particles were purified by centrifugation to prepare Cu—Sn bimetallic metal nanoparticles.

After the Cu—Sn bimetallic metal nanoparticles were dispersed in 300 mL of ethanol, 15 mmol of zinc ethylxanthate was dissolved therein, followed by heating to 78° C. and stirring for 3 hours, to prepare an aggregate-phase composite including a Cu—Sn phase and a ZnS phase.

EXAMPLE 11

A mix solution containing 17 mmol of $CuCl_2$ and 10 mmol of $SnCl_4.5H_2O$ was added dropwise to a solution of 80 mmol of $NaBH_4$ and 27 mmol of cysteamine in distilled water at room temperature for 1 hour, the mixture was reacted under stirring for 5 hours, and the formed particles were purified by centrifugation to prepare Cu—Sn bimetallic metal nanoparticles.

After the Cu—Sn bimetallic metal nanoparticles were dispersed in 300 mL of ethanol, 15 mmol of zinc ethylxanthate was dissolved therein, followed by heating to 78° C. and stirring for 3 hours, to prepare an aggregate-phase composite including a Cu—Sn phase and a ZnS phase.

The scanning electron microscope (SEM) image and XRD graph of the formed particles are shown in FIGS. 5 and 6. In addition, the shape of these particles analyzed by TEM and composition analysis results thereof using line scanning are shown in FIGS. 7 and 8. As can be seen from XRD analysis results of FIGS. 5 and 6, the particles are present as a combination of a Cu—Sn bimetallic phase including a mixture of a $Cu_6Sn_5$ crystal phase and a Cu-rich Cu—Sn crystal phase, with a ZnS crystal phase, or present as an aggregate-phase composite including uniformly distributed Cu—Sn and ZnS phases, or core-shell structured nanoparticles including Cu—Sn with ZnS.

EXAMPLE 12

A mix solution containing 17 mmol of $Cu(NO_3)_2$ and 10 mmol of $SnCl_4.5H_2O$ was added dropwise to a solution of 80 mmol of $NaBH_4$ and 27 mmol of cysteamine in distilled water at room temperature for 1 hour, the mixture was reacted under stirring for 5 hours, and the formed particles were purified by centrifugation to prepare Cu—Sn bimetallic metal nanoparticles.

After the Cu—Sn bimetallic metal nanoparticles were dispersed in 300 mL of ethanol, 15 mmol of zinc ethylxanthate was dissolved therein, followed by heating to 78° C. and stirring for 3 hours, to prepare an aggregate-phase composite including a Cu—Sn phase and a ZnS phase.

EXAMPLE 13

A mix solution containing 17 mmol of $CuCl_2.2H_2O$ and 10 mmol of $SnCl_4.5H_2O$ was added dropwise to a solution of 270 mmol of $NaBH_4$ and 27 mmol of cysteamine in distilled water at room temperature for 1 hour, the mixture was reacted under stirring for 5 hours, and the formed particles were purified by centrifugation to prepare Cu—Sn bimetallic metal nanoparticles.

After the Cu—Sn bimetallic metal nanoparticles were dispersed in 300 mL of ethanol, 10 mmol of zinc acetate and 20 mmol of thioacetamide were dissolved therein, followed by heating to 70° C. and stirring for 3 hours, to prepare an aggregate-phase composite including a Cu—Sn phase and a ZnS phase.

EXAMPLE 14

A mix solution containing 17 mmol of $CuCl_2.2H_2O$ and 10 mmol of $SnCl_4.5H_2O$ was added dropwise to a solution of 270 mmol of $NaBH_4$ and 27 mmol of cysteamine in distilled water at room temperature for 1 hour, the mixture was reacted under stirring for 5 hours, and the formed particles were purified by centrifugation to prepare Cu—Sn bimetallic metal nanoparticles.

After the Cu—Sn bimetallic metal nanoparticles were dispersed in 300 mL of ethanol, 10 mmol of zinc acetate, 20 mmol of thioacetamide and 10 mmol of cysteamine were dissolved in the dispersion, followed by heating to 70° C. and stirring for 3 hours, to prepare an aggregate-phase composite including a Cu—Sn phase and a ZnS phase.

EXAMPLE 15

A mix solution containing 17 mmol of $CuCl_2.2H_2O$ and 10 mmol of $SnCl_4.5H_2O$ was added dropwise to a solution of 270 mmol of $NaBH_4$ and 27 mmol of mercaptoethanol in distilled water at room temperature for 1 hour, the mixture was reacted under stirring for 5 hours, and the formed particles were purified by centrifugation to prepare Cu—Sn bimetallic metal nanoparticles.

After the Cu—Sn bimetallic metal nanoparticles were dispersed in 300 mL of ethanol, 10 mmol of zinc acetate, 20 mmol of thioacetamide and 10 mmol of mercaptoethanol were dissolved in the dispersion, followed by heating to 70° C. and stirring for 3 hours, to prepare an aggregate-phase composite including a Cu—Sn phase and a ZnS phase.

EXAMPLE 16

A mix aqueous solution containing 280 mmol of $NaBH_4$, 18 mmol of $Cu(NO_3)_2$, 10 mmol of $SnCl_2$ and 28 mmol of trisodium citrate was added dropwise at room temperature for 1 hour, the mixture was reacted under stirring for 24 hours, and the formed particles were purified by centrifugation, to prepare Cu—Sn bimetallic metal nanoparticles including a mixture of $Cu_6Sn_5$ and $Cu_{41}Sn_{11}$.

After the Cu—Sn bimetallic metal nanoparticles were dispersed in 300 mL of ethanol, 10 mmol of zinc acetate, 20 mmol of thioacetamide and 10 mmol of mercaptoethanol were dissolved therein, followed by heating to 70° C. and stirring for 3 hours, to prepare an aggregate-phase composite including a Cu—Sn phase and a ZnS phase.

EXAMPLE 17

A mix solution containing 17 mmol of $CuCl_2.2H_2O$ and 10 mmol of $SnCl_4.5H_2O$ was added dropwise to a solution of 270 mmol of $NaBH_4$, 27 mmol of cysteamine hydrochloride and 27 mmol of NaOH in distilled water, at room temperature for 1 hour, the mixture was reacted under stirring for 5 hours, and the formed particles were purified by centrifugation to prepare Cu—Sn bimetallic metal nanoparticles.

After the Cu—Sn bimetallic metal nanoparticles were dispersed in 300 mL of distilled water, 10 mmol of zinc acetate and 20 mmol of thioacetamide were dissolved in the dispersion, followed by heating to 70° C. and stirring for 3 hours, to prepare an aggregate-phase composite including a Cu—Sn phase and a ZnS phase.

EXAMPLE 18

A mix solution containing 17 mmol of $CuCl_2.2H_2O$ and 10 mmol of $SnCl_4.5H_2O$ was added dropwise to a solution of 270 mmol of $NaBH_4$ and 27 mmol of cysteamine hydrochloride in distilled water at room temperature for 0.5 hours, the mixture was reacted under stirring for 5 hours, and the formed particles were purified by centrifugation to prepare Cu—Sn bimetallic metal nanoparticles.

After the Cu—Sn bimetallic metal nanoparticles were dispersed in 300 mL of distilled water, 10 mmol of zinc acetate, 20 mmol of thioacetamide and 5 mL of $NH_4OH$ were dissolved in the dispersion, followed by heating to 50° C. and stirring for 3 hours, to prepare an aggregate-phase composite including a Cu—Sn phase and a ZnS phase.

EXAMPLE 19

A mix solution containing 17 mmol of $CuCl_2.2H_2O$, 10 mmol of $SnCl_2$ and 28 mmol of trisodium citrate was added dropwise to a solution of 300 mmol of $NaBH_4$ and 27 mmol of cysteamine hydrochloride in distilled water at room temperature for 1 hour, the mixture was reacted under stirring for 4 hours, and the formed particles were purified by centrifugation to prepare Cu—Sn bimetallic metal nanoparticles.

After the Cu—Sn bimetallic metal nanoparticles were dispersed in 300 mL of ethanol, 10 mmol of zinc acetate, 20 mmol of thioacetamide and 10 mmol of mercaptoethanol were dissolved in the dispersion, followed by heating to 70° C. and stirring for 3 hours, to prepare an aggregate-phase composite including a Cu—Sn phase and a ZnS phase.

EXAMPLE 20

A mix solution containing 17 mmol of $CuCl_2.2H_2O$, 10 mmol of $SnCl_2.5H_2O$ and 28 mmol of trisodium citrate was added dropwise to a solution of 300 mmol of $NaBH_4$ and 27 mmol of cysteamine hydrochloride in distilled water at room temperature for 1 hour, the mixture was reacted under stirring for 4 hours, and the formed particles were purified by centrifugation to prepare Cu—Sn bimetallic metal nanoparticles.

After the Cu—Sn bimetallic metal nanoparticles were dispersed in 300 mL of ethanol, 10 mmol of zinc acetate, 20 mmol of thioacetamide and 10 mmol of cysteamine were dissolved in the dispersion, followed by heating to 70° C. and stirring for 3 hours, to prepare an aggregate-phase composite including a Cu—Sn phase and a ZnS phase.

EXAMPLE 21

A mix solution containing 17 mmol of $CuCl_2.2H_2O$, 10 mmol of $SnCl_2$ and 28 mmol of trisodium citrate was added dropwise to a solution of 300 mmol of $NaBH_4$ and 27 mmol of cysteamine hydrochloride in distilled water at room temperature for 1 hour, the mixture was reacted under stirring for 4 hours, and the formed particles were purified by centrifugation to prepare Cu—Sn bimetallic metal nanoparticles.

After the Cu—Sn bimetallic metal nanoparticles were dispersed in 300 mL of ethanol, 10 mmol of zinc acetate, 20 mmol of thioacetamide and 5 mmol of ascorbic acid were dissolved in the dispersion, followed by heating to 70° C. and stirring for 3 hours, to prepare an aggregate-phase composite including a Cu—Sn phase and a ZnS phase.

EXAMPLE 22

A DMSO solution containing 14 mmol of $Cu(NO_3)_2$ and 10 mmol of $SnCl_4.5H_2O$ was added dropwise to a DMSO solution containing 80 mmol of $NaBH_4$ at 60° C. for 1 hour, the mixture was reacted under stirring for 6 hours, and the formed particles were purified by centrifugation to prepare Cu—Sn bimetallic metal nanoparticles.

After the Cu—Sn bimetallic metal nanoparticles were dispersed in 300 mL of ethanol, 15 mmol of zinc ethylxanthate was dissolved therein, followed by heating to 78° C. and stirring for 3 hours. After washing, the residue was dispersed in 100 mL of ethanol, the dispersion was added dropwise to a solution of 3 mmol of $CuCl_2$ in 50 mL of ethanol, and the mixture was stirred for 12 hours to prepare an aggregate-phase composite including a Cu—Sn phase and a ZnS—CuS phase.

The line-scanning result, scanning electron microscope (SEM) image and XRD graph of the formed particles are shown in FIGS. 9 to 11.

From line-scan analysis results, it can be seen that the particles include a Cu component rich in the shell part. From XRD analysis results, the particles are present as a combination of a Cu—Sn bimetallic phase including a mixture of a $Cu_6Sn_5$ crystal phase and a Cu-rich Cu—Sn crystal phase, with a ZnS—CuS crystal phase, or are present as an aggregate-phase composite including uniformly distributed Cu—Sn and ZnS—CuS phases, or as core-shell structured nanoparticles including Cu—Sn coated with ZnS and CuS.

EXAMPLE 23

A mix solution containing 14 mmol of Cu(NO$_3$)$_2$ and 10 mmol of SnCl$_4$.5H$_2$O was added dropwise to an NMP solution containing 80 mmol of NaBH$_4$ at 90° C. for 1 hour, the mixture was reacted under stirring for 6 hours, and the formed particles were purified by centrifugation to prepare Cu—Sn bimetallic metal nanoparticles.

After the Cu—Sn bimetallic metal nanoparticles were dispersed in 300 mL of ethanol, 15 mmol of zinc ethylxanthate was dissolved therein, followed by heating to 78° C. and stirring for 3 hours. After washing, the residue was dispersed in 100 mL of ethanol, the dispersion was added dropwise to a solution of 3 mmol of CuCl$_2$ in 50 mL of ethanol, and the mixture was stirred for 12 hours, to prepare an aggregate-phase composite including a Cu—Sn phase and a ZnS—CuS phase.

EXAMPLE 24

A mix solution containing 17 mmol of CuCl$_2$ and 10 mmol of SnCl$_4$.5H$_2$O was added dropwise to a solution of 80 mmol of NaBH$_4$, and 27 mmol of cysteamine in distilled water at room temperature for 1 hour, the mixture was reacted under stirring for 5 hours, and the formed particles were purified by centrifugation to prepare Cu—Sn bimetallic metal nanoparticles.

After the Cu—Sn bimetallic metal nanoparticles were dispersed in 300 mL of ethanol, 15 mmol of zinc ethylxanthate was dissolved therein, followed by heating to 78° C. and stirring for 3 hours. After washing, the residue was dispersed in 100 mL of ethanol, the dispersion was added dropwise to a solution of 3 mmol of CuCl$_2$ in 50 mL of ethanol and the mixture was stirred for 12 hours, to prepare an aggregate-phase composite including a Cu—Sn phase and a ZnS—CuS phase.

The scanning electron microscope (SEM) image and the XRD graph of the formed particles are shown in FIGS. 12 and 13.

EXAMPLE 25

A mix solution containing 17 mmol of Cu(NO$_3$)$_2$ and 10 mmol of SnCl$_4$.5H$_2$O was added dropwise to a solution of 80 mmol of NaBH$_4$ and 27 mmol of cysteamine in distilled water at room temperature for 1 hour, the mixture was reacted under stirring for 5 hours, and the formed particles were purified by centrifugation to prepare Cu—Sn bimetallic metal nanoparticles.

After the Cu—Sn bimetallic metal nanoparticles were dispersed in 300 mL of ethanol, 15 mmol of zinc ethylxanthate was dissolved therein, followed by heating to 78° C. and stirring for 3 hours. After washing, the residue was dispersed in 100 mL of ethanol, the dispersion was added dropwise to a solution of 3 mmol of CuCl$_2$ in 50 mL of ethanol and the mixture was stirred for 12 hours, to prepare an aggregate-phase composite including a Cu—Sn phase and a ZnS—CuS phase.

EXAMPLE 26

A mix solution containing 17 mmol of Cu(NO$_3$)$_2$ and 10 mmol of SnCl$_4$ 5H$_2$O was added dropwise to a solution of 80 mmol of NaBH$_4$ and 27 mmol of cysteamine in distilled water at room temperature for 1 hour, the mixture was reacted under stirring for 5 hours, and the formed particles were purified by centrifugation to prepare Cu—Sn bimetallic metal nanoparticles.

A solution of 15 mmol of zinc nitrate in 50 ml of water was added dropwise to a dispersion of the Cu—Sn bimetallic metal nanoparticles, the mixture was stirred for 1 hour, a solution of 15 mmol of Na$_2$S in 70 ml of distilled water was added dropwise to the reaction mixture for 1 hour, the resulting mixture was reacted for 3 hours, 3 mmol of CuCl$_2$ was added again to the reaction mixture, and the resulting mixture was reacted at 25° C. to prepare a precursor including nanoparticles having a structure composed of a Cu—Sn core and a ZnS—CuS shell.

EXAMPLE 27

A tetraethylene glycol mix solution containing 18 mmol of CuCl$_2$ and 10 mmol of SnCl$_2$ was slowly added dropwise to a triethylene glycol mix solution containing 150 mmol of NaBH$_4$, and the mixture was reacted under stirring for 3 hours and purified to prepare Cu—Sn bimetallic metal nanoparticles including a mixture of Cu$_6$Sn$_5$ and Cu-rich Cu—Sn(Cu$_{41}$Sn$_{11}$).

A solution of 15 mmol of zinc nitrate in 50 ml of water was added to a dispersion of the Cu—Sn bimetallic metal nanoparticles, the mixture was stirred for 1 hour, a solution of 15 mmol of Na$_2$S in 70 ml of distilled water was added dropwise to the reaction mixture for 1 hour, the resulting mixture was reacted for 3 hours, 3 mmol of CuCl$_2$ was added again to the reaction mixture, and the resulting mixture was reacted at 25° C. to prepare a precursor including nanoparticles having a structure composed of a Cu—Sn core and a ZnS—CuS shell.

EXAMPLE 28

An aqueous solution containing 15 mmol of CuCl$_2$ and 10 mmol of SnCl$_2$ was slowly added dropwise to a solution of 150 mmol of NaBH$_4$ in distilled water at 50° C., and the mixture was reacted under stirring for 1 hour and purified to prepare Cu—Sn bimetallic metal nanoparticles including a mixture of Cu$_6$Sn$_5$ and Cu-rich Cu—Sn, for example, Cu$_3$Sn, Cu$_{10}$Sn$_3$, or Cu$_{41}$Sn$_{11}$.

A solution of 15 mmol of zinc nitrate in 50 ml of water was added to a dispersion of the Cu—Sn bimetallic metal nanoparticles, the mixture was stirred for 1 hour, a solution of 15 mmol of Na$_2$S in 70 ml of distilled water was added dropwise to the reaction mixture for 1 hour, the resulting mixture was reacted for 3 hours, 3 mmol of CuCl$_2$ was added again to the reaction mixture, and the resulting mixture was reacted at 25° C. to prepare a precursor including nanoparticles having a structure composed of a Cu—Sn core and a ZnS—CuS shell.

EXAMPLE 29

A mix solution containing 20 mmol of CuCl$_2$ and 10 mmol of SnCl$_2$ was added dropwise to a DMSO solution containing 150 mmol of NaBH$_4$ at 80° C. for 1 hour, the mixture was reacted under stirring for 24 hours, and the formed particles were purified by centrifugation to prepare Cu—Sn bimetallic metal nanoparticles including a mix phase of Cu$_{6.26}$Sn$_5$ and Cu$_{10}$Sn$_3$.

A solution of 15 mmol of zinc nitrate in 50 ml of water was added to a dispersion of the Cu—Sn bimetallic metal nanoparticles, the mixture was stirred for 1 hour, a solution of 15 mmol of Na$_2$S in 70 ml of distilled water was added dropwise to the reaction mixture for 1 hour, the resulting mixture was reacted for 3 hours, 3 mmol of $CuCl_2$ was added again to the reaction mixture, and the resulting mixture was reacted at 25° C. to prepare a precursor including nanoparticles having a structure composed of a Cu—Sn core and a ZnS—CuS shell.

EXAMPLE 30

A mix aqueous solution containing 18 mmol of $CuCl_2$, 10 mmol of $SnCl_2$, and 50 mmol of trisodium citrate was added dropwise to an aqueous solution containing 120 mmol of $NaBH_4$ for 1 hour, the mixture was reacted under stirring for 24 hours, and the formed particles were purified by centrifugation to prepare Cu—Sn bimetallic metal nanoparticles including a mixture of $Cu_6Sn_5$ and $Cu_{41}Sn_{11}$.

A solution of 15 mmol of zinc nitrate in 50 ml of water was added to a dispersion of the Cu—Sn bimetallic metal nanoparticles, the mixture was stirred for 1 hour, a solution of 15 mmol of $Na_2S$ in 70 ml of distilled water was added dropwise to the reaction mixture for 1 hour, the resulting mixture was reacted for 3 hours, 3 mmol of $CuCl_2$ was added again to the reaction mixture, and the resulting mixture was reacted at 25° C. to prepare a precursor including nanoparticles having a structure composed of a Cu—Sn core and a ZnS—CuS shell.

EXAMPLE 31

A mix aqueous solution containing 16 mmol of $CuCl_2$ and 10 mmol of $SnCl_4$ was added dropwise to an aqueous solution containing 120 mmol of $NaBH_4$ for 1 hour, the mixture was reacted under stirring for 24 hours, and the formed particles were purified by centrifugation to prepare Cu—Sn bimetallic metal nanoparticles.

A solution of 15 mmol of zinc nitrate in 50 ml of water was added to a dispersion of the Cu—Sn bimetallic metal nanoparticles, the mixture was stirred for 1 hour, a solution of 15 mmol of $Na_2S$ in 70 ml of distilled water was added dropwise to the reaction mixture for 1 hour, the resulting mixture was reacted for 3 hours, 3 mmol of $CuCl_2$ was added again to the reaction mixture, and the resulting mixture was reacted at 25° C. to prepare a precursor including nanoparticles having a structure composed of a Cu—Sn core and a ZnS—CuS shell.

EXAMPLE 32

A mix aqueous solution containing 16 mmol of $CuCl_2$ and 10 mmol of $SnCl_4$ was added dropwise to an aqueous solution containing 120 mmol of $NaBH_4$ for 1 hour, the mixture was reacted under stirring for 24 hours, and the formed particles were purified by centrifugation to prepare Cu—Sn bimetallic metal nanoparticles.

A solution of 15 mmol of zinc nitrate in 50 ml of water was added to a dispersion of the Cu—Sn bimetallic metal nanoparticles, the mixture was stirred for 1 hour, a solution of 15 mmol of $Na_2S$ in 70 ml of distilled water was added dropwise to the reaction mixture for 1 hour, the resulting mixture was reacted for 3 hours, 3 mmol of $CuCl_2$ was added again to the reaction mixture, and the resulting mixture was reacted at 25° C. to prepare the precursor including nanoparticles having a structure composed of a Cu—Sn core and a ZnS—CuS shell.

EXAMPLE 33

A mix aqueous solution containing 18 mmol of $CuCl_2$ and 10 mmol of $SnCl_2$ was added dropwise to a dimethyl formamide solution containing 120 mmol of $NaBH_4$ for 1 hour, the mixture was reacted under stirring for 24 hours, and the formed particles were purified by centrifugation to prepare Cu—Sn bimetallic metal nanoparticles.

After the Cu—Sn bimetallic metal nanoparticles were dispersed in isopropanol, a solution of 10 mmol of $ZnCl_2$ and 15 mmol of thioacetamide was added to the dispersion, the mixture was reacted at 80° C. for 3 hours, 3 mmol of $CuCl_2$ was added again thereto and the resulting mixture was reacted at 25° C. to prepare an aggregate-phase composite including a Cu—Sn phase and a ZnS—CuS phase.

EXAMPLE 34

A mix solution containing 17 mmol of $CuCl_2.2H_2O$, 10 mmol of $SnCl_2$ and 28 mmol of trisodium citrate was added dropwise to a solution of 300 mmol of $NaBH_4$ and 27 mmol of cysteamine hydrochloride in distilled water at room temperature for 1 hour, the mixture was reacted under stirring for 4 hours and the formed particles were purified by centrifugation to prepare Cu—Sn bimetallic metal nanoparticles.

After the Cu—Sn bimetallic metal nanoparticles were dispersed in 300 mL of ethanol, 10 mmol of zinc acetate, 20 mmol of thioacetamide and 10 mmol of mercaptoethanol were dissolved in the dispersion, the mixture was reacted at 80° C. for 3 hours, 3 mmol of $CuCl_2$ was added again thereto and the resulting mixture was reacted at 25° C. to prepare an aggregate-phase composite including a Cu—Sn phase and a ZnS—CuS phase.

COMPARATIVE EXAMPLE 1

5 mmol of an aqueous zinc nitrate solution and 10 mmol of $Na_2S$ were each dissolved in 100 ml of distilled water, followed by mixing. Then, the mixture was reacted at room temperature for 5 hours and the formed particles were purified by centrifugation to prepare ZnS nanoparticles.

COMPARATIVE EXAMPLE 2

5 mmol of an aqueous copper chloride solution and 10 mmol of $Na_2S$ were each dissolved in 100 ml of distilled water, followed by mixing. Then, the mixture was heated to 50° C. and reacted for 2 hours, and the formed particles were purified by centrifugation to prepare CuS nanoparticles.

COMPARATIVE EXAMPLE 3

5 mmol of an aqueous tin chloride solution and 10 mmol of $Na_2S$ were each dissolved in 100 ml of distilled water, followed by mixing. Then, the mixture was heated to 50° C. and reacted for 2 hours, and the formed particles were purified by centrifugation to prepare SnS nanoparticles.

COMPARATIVE EXAMPLE 4

100 ml (5 mmol) of an aqueous zinc chloride solution was mixed with 100 ml (10 mmol) of a NaHSe aqueous solution, followed by reacting at room temperature for 5 hours. The formed particles were purified by centrifugation to prepare ZnSe nanoparticles.

EXAMPLE 35

Production of Thin Film

The Cu—Sn/ZnS precursor produced in Example 1 was added to a mixed solvent including ethanol, ethylene glycol monomethyl ether, acetyl acetone, propylene glycol propyl ether, cyclohexanone, ethanolamine, 1,2-propanediol, diethylene glycolmonoethyl ether, glycerol, and sodium dodecyl sulfate, followed by dispersing at a concentration of 21%, to prepare an ink. The resulting ink was coated on a Mo thin film coated on glass and dried at 200° C. The film was heat-treated in the presence of Se at 550° C. to obtain a CZTS thin film. The cross-sectional shape and XRD phase of the obtained thin film are shown in FIGS. 14 and 15. As can be seen from FIGS. 14 and 15, the thin film according to the present invention has a uniform composition and a high density, and includes well-grown grains.

EXAMPLE 36

Production of Thin Film

A CZTS thin film was obtained in the same manner as in Example 35, except that the precursor produced in Example 2 was used.

EXAMPLE 37

Production of Thin Film

A CZTS thin film was obtained in the same manner as in Example 35, except that the precursor produced in Example 3 was used. An SEM image of cross-sectional shapes of the obtained thin film is shown in FIG. 16. As can be seen from FIG. 16, the thin film according to the present invention has a high density and includes well-grown grains.

EXAMPLE 38

Production of Thin Film

A CZTS thin film was obtained in the same manner as in Example 35, except that the precursor produced in Example 4 was used.

EXAMPLE 39

Production of Thin Film

A CZTS thin film was obtained in the same manner as in Example 35, except that the precursor produced in Example 5 was used.

EXAMPLE 40

Production of Thin Film

A CZTS thin film was obtained in the same manner as in Example 35, except that the precursor produced in Example 6 was used.

EXAMPLE 41

Production of Thin Film

A CZTS thin film was obtained in the same manner as in Example 35, except that the precursor produced in Example 7 was used.

EXAMPLE 42

Production of Thin Film

A CZTS thin film was obtained in the same manner as in Example 35, except that the precursor produced in Example 8 was used.

EXAMPLE 43

Production of Thin Film

A CZTS thin film was obtained in the same manner as in Example 35, except that the precursor produced in Example 9 was used. The SEM image of cross-sectional shapes of the obtained thin film and composition analysis results through an XRD graph are shown in FIGS. 17 and 18. As can be seen from FIG. 17, the thin film according to the present invention has a high density and includes well-grown grains.

EXAMPLE 44

Production of Thin Film

A CZTS thin film was obtained in the same manner as in Example 35, except that the precursor produced in Example 10 was used.

EXAMPLE 45

Production of Thin Film

A CZTS thin film was obtained in the same manner as in Example 35, except that the precursor produced in Example 11 was used.

EXAMPLE 46

Production of Thin Film

A CZTS thin film was obtained in the same manner as in Example 35, except that the precursor produced in Example 12 was used.

EXAMPLE 47

Production of Thin Film

A CZTS thin film was obtained in the same manner as in Example 35, except that the precursor produced in Example 22 was used. The SEM image and XRD phase of cross-sectional shapes of the obtained thin film are shown in FIGS. 19 and 20.

EXAMPLE 48

Production of Thin Film

A CZTS thin film was obtained in the same manner as in Example 35, except that the precursor produced in Example 24 was used. The SEM image and EDX result of cross-sectional shapes of the obtained thin film are shown in FIGS. 21 and 22.

COMPARATIVE EXAMPLE 5

Production of Thin Film

Cu—Sn metal nanoparticles and ZnS nanoparticles produced in Comparative Example 1 were mixed in a ratio satisfying Cu/(Zn+Sn)=0.9 and Zn/Sn=1.2, the mixture was added to a mixed solvent containing ethanol, ethylene glycol monomethyl ether, acetyl acetone, propylene glycol propyl ether, cyclohexanone, ethanolamine, 1,2-propanediol, diethylene glycol monoethyl ether, glycerol, and sodium dodecyl sulfate, followed by dispersing at a concentration of 21% to prepare an ink. The obtained ink was coated on a Mo thin film coated on glass and dried at 200° C. The film was heat-treated in the presence of Se at 550° C. to obtain a CZTS thin film.

COMPARATIVE EXAMPLE 6

Production of Thin Film

Cu—Sn metal nanoparticles and ZnSe nanoparticles produced in Comparative Example 4 were mixed in a ratio satisfying Cu/(Zn+Sn)=0.8 and Zn/Sn=1.1, the mixture was added to a mixed solvent containing ethanol, ethylene glycol monomethyl ether, acetyl acetone, propylene glycol propyl ether, cyclohexanone, ethanolamine, 1,2-propanediol, diethylene glycol monoethyl ether, glycerol, and sodium dodecyl sulfate, followed by dispersing at a concentration of 21% to prepare an ink. The obtained ink was coated on a Mo thin film coated on glass and dried at 200° C. The film was heat-treated in the presence of Se at 550° C. to obtain a CZTS thin film.

COMPARATIVE EXAMPLE 7

Production of Thin Film

ZnS nanoparticles, CuS nanoparticles and SnS nanoparticles produced in Comparative Examples 1 to 3 were mixed in a ratio satisfying Cu/(Zn+Sn)=0.9 and Zn/Sn=1.2, the mixture was added to a mixed solvent containing ethanol, ethylene glycol monomethyl ether, acetyl acetone, propylene glycol propyl ether, cyclohexanone, ethanolamine, 1,2-propanediol, diethylene glycol monoethyl ether, glycerol, and sodium dodecyl sulfate, followed by dispersing at a concentration of 21% to prepare an ink. The obtained ink was coated on a Mo thin film coated on glass and dried at 200° C. The film was heat-treated in the presence of Se at 550° C. to obtain a CZTS thin film. The SEM image and EDX result of cross-sectional shapes of the obtained thin film are shown in FIGS. 23 and 24.

<Test Example 1>

A CdS buffer layer was formed on each of CZTS thin films produced in Examples 35 to 37, and 44 to 48 and Comparative Examples 5 to 7 by CBD, ZnO and Al:ZnO were sequentially deposited thereon by sputtering, and an Ag electrode was laminated thereon by screen printing to produce cells. The characteristics of the cells are shown in Table 1. In addition, the graph obtained from characteristics of the cells using the thin films of Examples 37 and 48, and IV property graphs obtained from Comparative Example 7 are shown in FIGS. 25, 26, and 27.

TABLE 1

|  | $J_{sc}$ (mA/cm$^2$) | $V_{oc}$ (V) | FF (%) | Photoelectric efficiency (%) |
| --- | --- | --- | --- | --- |
| Example 35 | 27.37 | 0.41 | 42.7 | 4.8 |
| Example 36 | 24.46 | 0.34 | 40.69 | 3.4 |
| Example 37 | 31.83 | 0.37 | 35.44 | 4.2 |
| Example 44 | 27.87 | 0.33 | 35.64 | 3.3 |
| Example 45 | 28.11 | 0.33 | 38.90 | 3.6 |
| Example 46 | 31.67 | 0.33 | 33.98 | 3.5 |
| Example 47 | 29.5 | 0.31 | 43.91 | 4.0 |
| Example 48 | 33.83 | 0.35 | 44.08 | 5.3 |
| Comparative Example 5 | 18.9 | 0.20 | 33.4 | 1.3 |
| Comparative Example 6 | 12.7 | 0.15 | 36.1 | 0.7 |
| Comparative Example 7 | 19.6 | 0.23 | 28.40 | 1.3 |

$J_{sc}$ which is a parameter determining an efficiency of solar cells shown in FIGS. 25 to 27 and Table 1 means current density, $V_{oc}$ means an open circuit voltage measured at zero output current, photoelectric efficiency means a ratio of cell power with respect to an energy amount of light incident upon a solar cell panel, and fill factor (FF) means a value calculated by dividing a value obtained by multiplying current density by voltage at a maximum power point by a value obtained by multiplying $V_{oc}$ by $J_{sc}$. In addition, $V_{mp}$ means voltage at a maximum power point and $J_{mp}$ means current at a maximum power point.

As can be seen from FIGS. 25 to 27 and Table 1, the CZTS thin films of Examples 35 to 37, and 44 to 48 using the precursors produced in the present invention exhibit high current density and voltage, and thus excellent photoelectric efficiency, as compared to thin films of Comparative Examples 5 to 7 produced by separately preparing metal nanoparticles or metal chalcogenide, and then mixing. Furthermore, even for precursors having the same core-shell structure, CZTS thin films of Examples 47 and 48 produced using the precursor including Cu in the shell part, particularly exhibits improved FF and thus exhibits excellent photoelectric efficiency, as compared to CZTS thin films of Examples 35 to 37, and 44 to 46 produced using the precursor not including Cu in the shell part.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

INDUSTRIAL APPLICABILITY

As apparent from the fore-going, the precursor for preparing a light absorption layer according to the present invention includes: (a) an aggregate-phase composite including a first phase including a copper (Cu)-tin (Sn) bimetallic metal and a second phase including zinc (Zn)-containing chalcogenide, or including the first phase including a copper (Cu)-tin (Sn) bimetallic metal, the second phase including zinc (Zn)-containing chalcogenide and a third phase including copper (Cu)-containing chalcogenide; or (b) core-shell structured nanoparticles including a core including copper (Cu)-tin (Sn) bimetallic metal nanoparticles and a shell including zinc (Zn)-containing chalcogenide, or the zinc (Zn)-containing chalcogenide and copper (Cu)-containing chalcogenide; or (c) a mixture thereof. When a thin film is produced using the precursor, the precursor can be synthesized from already homogenously mixed elements, so that the thin film can have an overall more uniform composition, formation of secondary phases can be minimized, a highly dense light absorption layer can be grown based on an increased volume of the precursor due to additional Group VI elements added during heat treatment through the first phase or core composed of bimetallic metals, and high-quality final thin films with an increased content of Group VI elements can be produced because the precursor includes the second phase or shell including S or Se.

In particular, core-shell structured nanoparticles have a structure in which a core including a copper (Cu)-tin (Sn) bimetallic metal is protected by a shell including zinc (Zn)-containing chalcogenide and copper (Cu)-containing chalcogenide, thus advantageously minimizing formation of oxides on surfaces of Cu—Sn bimetallic particles constituting the core to improve reactivity. In particular, particles including both zinc-containing chalcogenide and copper-containing chalcogenide obtained by substituting zinc-containing chalcogenide particles by Cu can have a low Cu/Sn ratio contained in the core, based on the same amount of Cu in the total particles, as compared to particles including only zinc-containing chalcogenide, thereby improving uniformity of copper elements in particles, suppressing formation of secondary phases upon heat treatment and improving thin film quality.

The invention claimed is:

1. A precursor for preparing a light absorption layer of a solar cell comprising:
   (a) an aggregate-phase composite including a first phase including a copper (Cu)-tin (Sn) bimetallic metal and a second phase including zinc (Zn)-containing chalcogenide, or including the first phase including a copper (Cu)-tin (Sn) bimetallic metal, the second phase including zinc (Zn)-containing chalcogenide and a third phase including copper (Cu)-containing chalcogenide; or
   (b) core-shell structured nanoparticles including a core including copper (Cu)-tin (Sn) bimetallic metal nanoparticles and a shell including zinc (Zn)-containing chalcogenide, or the zinc (Zn)-containing chalcogenide and copper (Cu)-containing chalcogenide; or
   (c) a mixture of (a) and (b).

2. The precursor according to claim 1, wherein the precursor for preparing a light absorption layer comprises core-shell structured nanoparticles which comprise:
   a core including copper (Cu)-tin (Sn) bimetallic metal nanoparticles; and
   a shell including zinc (Zn)-containing chalcogenide, or the zinc (Zn)-containing chalcogenide and copper (Cu)-containing chalcogenide.

3. The precursor according to claim 1, wherein the Cu—Sn bimetallic metal has a Cu/Sn ratio (on a mole basis) of 1 or more.

4. The precursor according to claim 3, wherein the Cu—Sn bimetallic metal comprises one or more selected from the group consisting of CuSn, $Cu_3Sn$, $Cu_{3.02}Sn_{0.98}$, $Cu_{10}Sn_3$, $Cu_{6.26}Sn_5$, $Cu_6Sn_5$, and $Cu_{41}Sn_{11}$.

5. The precursor according to claim 1, wherein, in the second phase and the third phase of the aggregate-phase composite or the shell of the core-shell structured nanoparticles, a ratio (on a mole basis) of Cu/Zn respectively comprised in the zinc (Zn)-containing chalcogenide and the copper (Cu)-containing chalcogenide is 0≤Cu/Zn≤20.

6. The precursor according to claim 1, wherein the zinc (Zn)-containing chalcogenide comprises one or more selected from the group consisting of ZnS and ZnSe.

7. The precursor according to claim 1, wherein the copper (Cu)-containing chalcogenide comprises one or more selected from the group consisting of $Cu_xS_y$ and $Cu_xSe_y$ (0<x<1, 0<y≤2).

8. The precursor according to claim 1, wherein the first phase, the second phase and the third phase are each independently present in the aggregate-phase composite.

9. The precursor according to claim 8, wherein the first phase, the second phase and the third phase are randomly distributed to form respective regions in the aggregate-phase composite.

10. The precursor according to claim 1, wherein the aggregate-phase composite has a particle size of 5 nanometers to 500 nanometers.

11. The precursor according to claim 1, wherein the core-shell structured nanoparticles have a particle size of 2 nanometers to 200 nanometers.

12. The precursor according to claim 1, wherein the aggregate-phase composite or the core-shell structured nanoparticles satisfy a metal composition of 0.5≤Cu/(Zn+Sn)≤1.5, and 0.5≤Zn/Sn≤2.

13. A method of producing the precursor for preparing a light absorption layer according to claim 1, comprising:
   (i) preparing a first solution containing a reducing agent and a second solution including a copper (Cu) salt and a tin (Sn) salt;
   (ii) reacting the first solution with the second solution by mixing to synthesize copper (Cu)-tin (Sn) bimetallic metal nanoparticles; and
   (iii) reacting a dispersion of the Cu—Sn bimetallic metal nanoparticles of step (ii) with a zinc (Zn)-ligand complex by mixing.

14. The method according to claim 13, further comprising, after step (iii), adding a copper (Cu) salt to the reaction product of step (iii), synthesizing a precursor for preparing a light absorption layer by Zn—Cu substitution reaction and purifying the precursor.

15. The method according to claim 13, wherein the solvent of the first to fourth solutions comprises one or more selected from the group consisting of water, alcohol, diethylene glycol, oleylamine, ethylene glycol, triethylene glycol, dimethyl sulfoxide, dimethyl formamide and N-methyl-2-pyrrolidone (NMP).

16. The method according to claim 13, wherein the salts of the copper (Cu) salt, the tin (Sn) salt and the zinc (Zn) salt each independently comprise one or more selected from the group consisting of fluoride, chloride, bromide, iodide, nitrate, nitrite, sulfate, acetate, citrate, sulfite, acetylacetonate, acrylate, cyanide, phosphate and hydroxide.

17. The method according to claim 13, wherein a ligand present in the ligand complex comprises one or more selected from the following compounds:

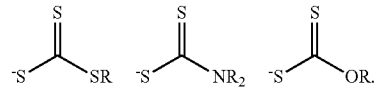

18. The method according to claim 13, wherein at least one of the first to fourth solutions further comprises a capping agent.

19. A method of producing the precursor for preparing a light absorption layer according to claim 1, comprising:
   (i) preparing a first solution containing a reducing agent and a second solution including a copper (Cu) salt and a tin (Sn) salt;
   (ii) reacting the first solution with the second solution by mixing to synthesize copper (Cu)-tin (Sn) bimetallic metal nanoparticles;
   (iii) preparing a third solution including at least one Group VI source selected from the group consisting of sulfur (S), selenium (Se), a sulfur (S)-containing compound and a selenium (Se)-containing compound, and a fourth solution including a zinc (Zn) salt; and
   (iv) reacting the third solution and the fourth solution with a dispersion of the Cu—Sn bimetallic metal nanoparticles of step (ii) by mixing.

20. The method according to claim 19, further comprising, after step (iv), adding a copper (Cu) salt to the reaction product of step (iv), synthesizing a precursor for preparing a light absorption layer by Zn—Cu substitution reaction and then purifying the precursor.

21. The method according to claim 19, wherein the Group VI source comprises one or more selected from the group consisting of Se, Na2Se, K2Se, CaSe, (CH3)2Se, SeO2, $SeS_2$, $Se_2S_6$, $Se_2Cl_2$, $Se_2Br_2$, $SeCl_4$, $SeBr_4$, $SeOCl_2$, $H_2SeO_3$, $H_2SeO_4$, S, $Na_2S$, $K_2S$, CaS, $(CH_3)_2S$, $H_2SO_4$, $Na_2S_2O_3$, and $NH_2SO_3H$, and hydrates thereof, $HSCH_2COOH$, thiolactic acid, mercaptoethanol, aminoethanethiol, thiourea, thioacetamide, and selenourea.

22. An ink composition comprising the precursor for preparing a light absorption layer according to claim 1 dispersed in a solvent.

23. A method of producing a thin film using the precursor for preparing a light absorption layer according to claim 1 comprising:
(i) dispersing, in a solvent, a precursor for preparing a light absorption layer comprising: (a) an aggregate-phase composite including a first phase including a copper (Cu)-tin (Sn) bimetallic metal and a second phase including zinc (Zn)-containing chalcogenide, or including the first phase including a copper (Cu)-tin (Sn) bimetallic metal, the second phase including zinc (Zn)-containing chalcogenide and a third phase including copper (Cu)-containing chalcogenide; or (b) core-shell structured nanoparticles including a core including copper (Cu)-tin (Sn) bimetallic metal nanoparticles and a shell including zinc (Zn)-containing chalcogenide, or the zinc (Zn)-containing chalcogenide and copper (Cu)-containing chalcogenide; or (c) a mixture of (a) and (b) to prepare an ink;
(ii) coating a substrate provided with an electrode with the ink; and
(iii) drying the ink coated on the substrate provided with an electrode and conducting heat treatment.

24. The method according to claim 23, further comprising adding an additive to prepare the ink in step (i).

25. A thin film produced by the method according to claim 23.

26. A thin film solar cell produced using the thin film according to claim 25.

* * * * *